United States Patent
Ding et al.

(10) Patent No.: US 11,538,747 B2
(45) Date of Patent: Dec. 27, 2022

(54) INTERPOSER STRUCTURE, SEMICONDUCTOR PACKAGE COMPRISING THE SAME, AND METHOD FOR FABRICATING THE SAME

(71) Applicant: Samsung Electronics Co., Ltd., Suwon-si (KR)

(72) Inventors: Shaofeng Ding, Suwon-si (KR); Jae June Jang, Seoul (KR); Jeong Hoon Ahn, Seongnam-si (KR); Yun Ki Choi, Yongin-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 0 days.

(21) Appl. No.: 16/881,452

(22) Filed: May 22, 2020

(65) Prior Publication Data

US 2021/0118794 A1    Apr. 22, 2021

(30) Foreign Application Priority Data

Oct. 21, 2019 (KR) .......................... 10-2019-0130613

(51) Int. Cl.
| | | |
|---|---|---|
| *H01L 29/76* | (2006.01) | |
| *H01L 29/00* | (2006.01) | |
| *H01L 23/522* | (2006.01) | |
| *H01L 49/02* | (2006.01) | |
| *H01L 23/48* | (2006.01) | |
| *H01L 23/498* | (2006.01) | |

(52) U.S. Cl.
CPC ........ *H01L 23/5223* (2013.01); *H01L 23/481* (2013.01); *H01L 23/49827* (2013.01); *H01L 28/60* (2013.01)

(58) Field of Classification Search
CPC .............. H01L 21/4857; H01L 23/481; H01L 23/49816; H01L 23/49827; H01L 23/5223; H01L 23/5383; H01L 23/5384; H01L 23/5385; H01L 28/60
USPC ......................................................... 257/532
See application file for complete search history.

(56) References Cited

U.S. PATENT DOCUMENTS

| | | | |
|---|---|---|---|
| 9,257,383 B2 | 2/2016 | England | |
| 9,691,684 B2 | 6/2017 | Park et al. | |
| 9,831,184 B2 | 11/2017 | Yee | |
| 9,929,085 B2 | 3/2018 | Fitzsimmons et al. | |
| 10,236,209 B2 | 3/2019 | Sharan et al. | |
| 2004/0021165 A1* | 2/2004 | Maeda .............. H01L 21/76807 |
| | | | 257/306 |

(Continued)

OTHER PUBLICATIONS

US 9,117,827 B1, 08/2015, Wang et al. (withdrawn)

*Primary Examiner* — Theresa T Doan
(74) *Attorney, Agent, or Firm* — Harness, Dickey & Pierce, P.L.C.

(57) ABSTRACT

Provided is an interposer structure. The interposer structure comprises an interposer substrate, an interlayer insulating film which covers a top surface of the interposer substrate, a capacitor structure in the interlayer insulating film and a wiring structure including a first wiring pattern and a second wiring pattern spaced apart from the first wiring pattern, on the interlayer insulating film, wherein the capacitor structure includes an upper electrode connected to the first wiring pattern, a lower electrode connected to the second wiring pattern, and a capacitor dielectric film between the upper electrode and the lower electrode.

19 Claims, 26 Drawing Sheets

(56) References Cited

U.S. PATENT DOCUMENTS

2008/0029801 A1* 2/2008 Nakamura .............. H01L 28/91
 257/E21.409
2015/0264813 A1 9/2015 Zhou et al.
2019/0164905 A1* 5/2019 Hsieh ................ H01L 23/49822

* cited by examiner

US 11,538,747 B2

INTERPOSER STRUCTURE, SEMICONDUCTOR PACKAGE COMPRISING THE SAME, AND METHOD FOR FABRICATING THE SAME

This application claims the benefit of Korean Patent Application No. 10-2019-0130613, filed on Oct. 21, 2019, in the Korean Intellectual Property Office, the disclosure of which is incorporated herein in its entirety by reference.

BACKGROUND

1. Field

The inventive concepts relate to an interposer structure, a semiconductor package including the same, and a method for fabricating the same. For example, the inventive concepts relate to an interposer structure including a capacitor, a semiconductor package including the same, and a method for fabricating the same.

2. Description of the Related Art

As the industry develops and multimedia develops, semiconductor devices used for computers, mobile devices, and the like become more highly integrated and/or have higher performance. In the case of a semiconductor device including a capacitor, an area occupied by the device decreases as the degree of integration increases, and meanwhile, it is required to maintain or increase capacitance required for the capacitor.

A MIM (Metal-Insulator-Metal) capacitor has been developed in which a high dielectric constant material is used as a dielectric film of a capacitor, and metal materials are used for a lower electrode and an upper electrode.

SUMMARY

Aspects of the inventive concepts provide an interposer structure including a capacitor with improved capacitance in a simplified process.

Aspects of the inventive concepts also provide a semiconductor package which includes an interposer structure including a capacitor with improved capacitance in a simplified process.

Aspects of the inventive concepts also provide a method for fabricating an interposer structure including a capacitor with improved capacitance in a simplified process.

According to an aspect of the present inventive concepts, there is provided an interposer structure comprising an interposer substrate, an interlayer insulating film which covers a top surface of the interposer substrate, a capacitor structure in the interlayer insulating film and a wiring structure including a first wiring pattern and a second wiring pattern spaced apart from the first wiring pattern, on the interlayer insulating film, wherein the capacitor structure includes an upper electrode connected to the first wiring pattern, a lower electrode connected to the second wiring pattern, and a capacitor dielectric film between the upper electrode and the lower electrode.

According to an aspect of the present inventive concepts, there is provided An interposer structure comprising: an interposer substrate; a first interlayer insulating film which covers a top surface of the interposer substrate, a capacitor structure in the first interlayer insulating film, a wiring structure which includes a second interlayer insulating film which covers a top surface of the first interlayer insulating film, and a plurality of wiring patterns and a plurality of vias in the second interlayer insulating film and a penetration via which penetrates the interposer substrate and the first interlayer insulating film and is connected to the wiring structure, wherein the capacitor structure is connected to the penetration via.

According to an aspect of the present inventive concepts, there is provided a semiconductor package comprising, a package substrate, an interposer structure which is mounted on the package substrate and a first semiconductor chip which is mounted on the interposer structure, wherein the interposer structure includes an interposer substrate, an interlayer insulating film which covers a top surface of the interposer substrate, a capacitor structure in the interlayer insulating film, and a wiring structure which covers a top surface of the interlayer insulating film and is connected to the first semiconductor chip.

According to an aspect of the present inventive concepts, there is provided a method for fabricating an interposer structure, the method comprising providing an interposer substrate, forming a capacitor structure on the interposer substrate, the capacitor structure including a lower electrode, a capacitor dielectric film extending along a profile of the lower electrode, and an upper electrode for covering the capacitor dielectric film, forming an interlayer insulating film which covers the interposer substrate and the capacitor structure and forming a wiring structure on the interlayer insulating film, the wiring structure including a first wiring pattern, and a second wiring pattern spaced apart from the first wiring pattern, wherein the first wiring pattern is connected to the lower electrode, and the second wiring pattern is connected to the upper electrode.

However, aspects of the inventive concepts are not restricted to the one set forth herein. The above and other aspects of the inventive concepts will become more apparent to one of ordinary skill in the art to which the inventive concepts pertain by referencing the detailed description of the inventive concepts given below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EMBODIMENTS

Hereinafter, an interposer structure according to some embodiments will be described with reference to FIGS. 1 to 7.

Figure 1:
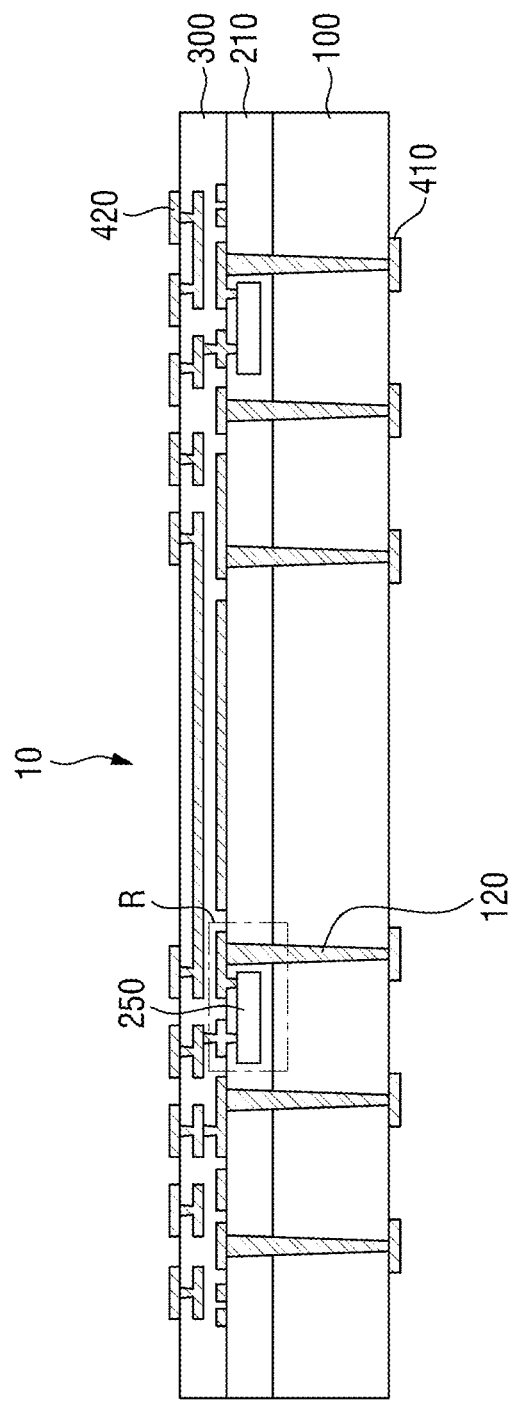
FIG. 1 is a schematic cross-sectional view for explaining an interposer structure according to some embodiments.

FIG. 1 is a schematic cross-sectional view for explaining an interposer structure according to some embodiments. FIGS. 2 to 7 are various enlarged views for explaining a region R of FIG. 1.

Figure 2:
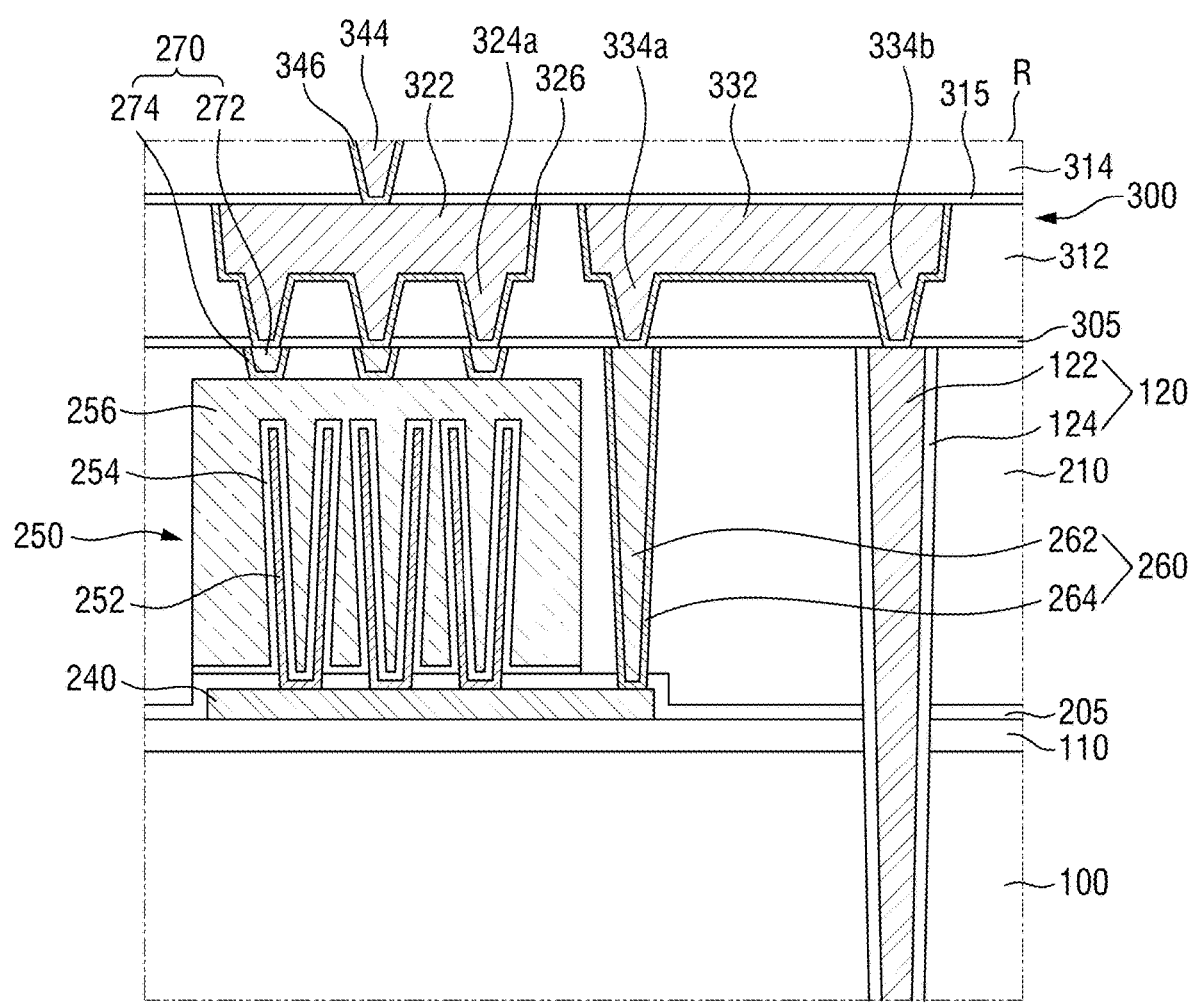
FIGS. 2 to 7 are various enlarged views for explaining a region R of FIG. 1.

Referring to FIGS. 1 and 2, an interposer structure 10 according to some embodiments includes an interposer substrate 100, a connection pattern 240, a capacitor structure 250, a first interlayer insulating film 210, a first penetration via 120, a wiring structure 300, a first conductive pad 410, and/or a second conductive pad 420.

The interposer substrate 100 may be a silicon substrate, a gallium arsenide substrate, a silicon germanium substrate, a ceramic substrate, a quartz substrate, a glass substrate, or the like, and may be an SOI (Semiconductor On Insulator substrate). In the following description, the interposer substrate 100 will be explained as a silicon substrate.

The interposer substrate 100 may function as a support substrate of the interposer structure 10. The interposer substrate 100 is a functional package substrate interposed between a package substrate (e.g., 20 of FIG. 8) and a semiconductor chip (e.g., 30 or 40 of FIG. 8). That is, the interposer substrate 100 is another concept that is different in scale, application, and the like from a semiconductor substrate on which active elements such as transistors are formed. The interposer structure 10 including the interposer substrate 100 may mount the semiconductor chips having different physical properties, and has an advantage of high packaging yield, unlike a system-on-chip (SoC).

The connection pattern 240 may be formed on the interposer substrate 100. The connection pattern 240 may extend along a part of a top surface of the interposer substrate 100. For example, a planarization insulating film 110 may be formed on the interposer substrate 100. The connection pattern 240 may extend along a part of the top surface of the planarization insulating film 110. The connection pattern 240 may include a conductive material. The planarization insulating film 110 may include, for example, but is not limited to, silicon oxide.

In some embodiments, a first etching prevention film 205 may be formed on the connection pattern 240. For example, the first etching prevention film 205 may conformally extend along the top surface of the planarization insulating film 110 and the top surface of the connection pattern 240. The first etching prevention film 205 may include, for example, but is not limited to, silicon nitride.

The capacitor structure 250 may be formed on the interposer substrate 100. In some embodiments, the capacitor structure 250 may be formed on the connection pattern 240. The capacitor structure 250 may include a lower electrode 252, a capacitor dielectric film 254 and an upper electrode 256.

In some embodiments, the lower electrode 252 may be connected to the connection pattern 240. For example, the lower electrode 252 may penetrate the first etching prevention film 205 and be connected to the connection pattern 240. That is, a bottom surface of the lower electrode 252 may be connected to the top surface of the connection pattern 240.

In some embodiments, the lower electrode 252 may have a shape protruding from the top surface of the connection pattern 240 in a direction intersecting the top surface of the connection pattern 240. For example, as shown in FIG. 2, the lower electrode 252 may include a plurality of cylinder structures having bottom surfaces connected to a top surface of the connection pattern 240.

The lower electrode 252 may include a conductive material. For example, the lower electrode 252 may include, but is not limited to, at least one of titanium (Ti), titanium nitride (TiN), tantalum (Ta), tantalum nitride (TaN), tungsten nitride (WN), metal silicide, and a combination thereof.

The capacitor dielectric film 254 may be formed on the lower electrode 252. For example, the capacitor dielectric film 254 may extend along a profile of the lower electrode 252. When the capacitor dielectric film 254 includes a plurality of cylinder structures, the capacitor dielectric film 254 may extend along the profiles of each of the cylinder structures.

The capacitor dielectric film 254 may include, for example, silicon oxide, silicon nitride, silicon oxynitride, and high-k materials having a dielectric constant higher than silicon oxide. Examples of the high-k material may include, for example, but is not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The upper electrode 256 may be formed on the capacitor dielectric film 254. The upper electrode 256 may cover the capacitor dielectric film 254. The upper electrode 256 may be spaced apart from the lower electrode 252 by the capacitor dielectric film 254. That is, the capacitor dielectric film 254 may be interposed between the lower electrode 252 and the upper electrode 256.

In some embodiments, the upper electrode 256 may expose a part of the top surface of the connection pattern 240. For example, as shown in FIG. 2, in the direction perpendicular to the top surface of the interposer substrate 100, a part of the top surface of the connection pattern 240 may not overlap the upper electrode 256.

The upper electrode 256 may include a conductive material. For example, the upper electrode 256 may include, but is not limited to, at least one of titanium (Ti), titanium nitride (TiN), tantalum (Ta), tantalum nitride (TaN), tungsten nitride (WN), metal silicide, and a combination thereof.

In some embodiments, the upper electrode 256 may include a semiconductor material such as polysilicon (poly Si) or silicon germanium (SiGe).

Different levels of voltage may be applied to the lower electrode 252 and the upper electrode 256. The capacitor structure 250 may store a charge in the capacitor dielectric film 254, using a potential difference generated between the lower electrode 252 and the upper electrode 256.

The first interlayer insulating film 210 may be formed on the interposer substrate 100. The first interlayer insulating film 210 may cover the top surface of the interposer substrate 100. For example, the first interlayer insulating film 210 may cover the first etching prevention film 205 and the capacitor structure 250. Therefore, the capacitor structure 250 may be formed in the first interlayer insulating film 210.

The first interlayer insulating film 210 may include, for example, at least one of silicon oxide, silicon nitride, silicon oxynitride, and a low-k material having a dielectric constant lower than silicon oxide. Examples of the low-k material may include, but is not limited to, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material and combinations thereof.

The first penetration via 120 may be one penetration via among a plurality of penetration vias penetrating the interposer substrate 100 and the first interlayer insulating film 210. In some embodiments, a bottom surface of the first penetration via 120 may be exposed from a bottom surface of the interposer substrate 100, and a top surface of the first penetration via 120 may be exposed from the top surface of the first interlayer insulating film 210.

In some embodiments, the first penetration via 120 may include a first conductive plug 122 and a first insulating spacer 124. The first conductive plug 122 extends in a direction perpendicular to the top surface of the interposer substrate 100, and may penetrate the interposer substrate 100 and the first interlayer insulating film 210. The first insulating spacer 124 may extend along a side surface of the first conductive plug 122. Therefore, the first conductive plug 122 may be insulated from the interposer substrate 100.

The first conductive plug 122 may include, for example, but is not limited to, a metal such as tungsten (W), titanium (Ti), tantalum (Ta), copper (Cu), aluminum (Al), and nickel (Ni). In the following description, the first conductive plug 122 will be described as including copper (Cu).

The first insulating spacer 124 may include, for example, but is not limited to, silicon oxide.

The width of the first penetration via 120 may increase as it goes away from the bottom surface of the interposer substrate 100. This may be attributed to the characteristics of the etching process for forming the first penetration via 120. However, this is merely an example, and the technical idea of the inventive concepts is not limited thereto. For example, along the direction in which the etching process for forming the first penetration via 120 is performed, the width of the first penetration via 120 may decrease as it goes away from the bottom surface of the interposer substrate 100.

The wiring structure 300 may be formed on the first interlayer insulating film 210. The wiring structure 300 may serve to redistribute pads of a semiconductor chip (e.g., 30 or 40 of FIG. 8) mounted on the interposer structure 10. For example, the wiring structure 300 includes a second etching prevention film 305, a second interlayer insulating film 312, a third etching prevention film 315 and/or a third interlayer insulating film 314 sequentially stacked on the first interlayer insulating film 210.

In addition, the wiring structure 300 may include a plurality of wiring patterns 322 and 332 and a plurality of vias 324a, 334a, 334b and 344. For example, the wiring structure 300 may include a first wiring pattern 322, a second wiring pattern 332, a first via 324a, a second via 334a and/or a third via 334b in the second interlayer insulating film 312. Further, for example, the wiring structure 300 may include a fourth via 344 in the third interlayer insulating film 314.

The first via 324a may extend from a bottom surface of the first wiring pattern 322. The second via 334a and the third via 334b may extend from the bottom surface of the second wiring pattern 332. The fourth via 344 may be formed on the first wiring pattern 322. The fourth via 344 may penetrate the third etching prevention film 315 and be connected to the top surface of the first wiring pattern 322.

The wiring patterns 322 and 332 and the vias 324a, 334a, 334b and 344 may be formed, for example, but are not limited to, by a damascene process.

In some embodiments, the wiring structure 300 may further include a plurality of barrier layers 326, 336 and 346.

For example, the wiring structure 300 may include a first barrier layer 326 and a second barrier layer 336 in the second interlayer insulating film 312. Further, for example, the wiring structure 300 may include a third barrier layer 346 in the third interlayer insulating film 314.

The first barrier layer 326 may extend along the bottom surfaces and the side surfaces of the first wiring pattern 322 and the first via 324a. The second barrier layer 336 may extend along the bottom surfaces and the side surfaces of the second wiring pattern 332, the second via 334a, and the third via 334b. The third barrier layer 346 may extend along a bottom surface and a side surface of the fourth via 344.

The barrier layers 326, 336 and 346 may reduce or prevent diffusion of the elements included in the wiring patterns 322 and 332 and the vias 324a, 334a, 334b and 344. For example, when the wiring patterns 322 and 332 and the vias 324a, 334a, 334b and 344 include copper (Cu), the barrier layers 326, 336 and 346 may include a material for reducing or preventing diffusion of copper (Cu).

The barrier layers 326, 336 and 346 may include, for example, but is not limited to, at least one of titanium (Ti), titanium nitride (TiN), tantalum (Ta), tantalum nitride (TaN), tungsten nitride (WN), metal silicide, and combinations thereof.

In some embodiments, the capacitor structure 250 may be electrically connected to the wiring structure 300. For example, the upper electrode 256 may be connected to the first wiring pattern 322, and the lower electrode 252 may be connected to the second wiring pattern 332.

In some embodiments, a first connection via 270 which connects the upper electrode 256 and the first wiring pattern 322 may be formed in the first interlayer insulating film 210. The first connection via 270 may, for example, penetrate the first interlayer insulating film 210 and connect the top surface of the upper electrode 256 and the bottom surface of the first via 324a. Therefore, the upper electrode 256 may be electrically connected to the first wiring pattern 322.

In some embodiments, the first connection via 270 may include a first wiring pattern 322 and a fourth barrier layer 274. The first wiring pattern 322 may extend in a direction perpendicular to the top surface of the interposer substrate 100. The fourth barrier layer 274 may extend along a bottom surface and a side surface of the first wiring pattern 322. The fourth barrier layer 274 may reduce or prevent diffusion of the elements included in the first wiring pattern 322. For example, when the first wiring pattern 322 includes tungsten (W), the fourth barrier layer 274 may include a material that reduces or prevents diffusion of tungsten (W).

In some embodiments, a second connection via 260 which connects the lower electrode 252 and the second wiring pattern 332 may be formed in the first interlayer insulating film 210. The second connection via 260 may, for example, penetrate the first interlayer insulating film 210 and connect the top surface of the connection pattern 240 and the bottom surface of the second via 334a. This allows the lower electrode 252 to be electrically connected to the second wiring pattern 332.

In some embodiments, the second connection via 260 may include a second wiring pattern 332 and a fifth barrier layer 264. The second wiring pattern 332 may extend in a direction perpendicular to the top surface of the interposer substrate 100. The fifth barrier layer 264 may extend along the bottom surface and the side surface of the second wiring pattern 332. The fifth barrier layer 264 may reduce or prevent diffusion of the elements included in the second wiring pattern 332. For example, when the second wiring pattern 332 includes tungsten (W), the fifth barrier layer 264 may include a material that reduces or prevents diffusion of tungsten (W).

In some embodiments, the first connection via 270 and the second connection via 260 may be formed at the same level. As used herein, the term "same level" means the level formed by the same fabricating process. For example, the first connection via 270 and the second connection via 260 may be formed by the same material configuration (e.g., tungsten (W)).

The first wiring pattern 322 and the second wiring pattern 332 may be spaced part from each other. Further, different levels of voltages from each other may be applied to the first wiring pattern 322 and the second wiring pattern 332. Therefore, voltages of different levels from each other may be applied to the lower electrode 252 and the upper electrode 256.

In some embodiments, the first penetration via 120 may be electrically connected to the capacitor structure 250. For example, the first penetration via 120 may be connected to one of the lower electrode 252 and the upper electrode 256.

In some embodiments, as shown in FIG. 2, the first penetration via 120 may penetrate the first interlayer insulating film 210 and be connected to the bottom surface of the third via 334b. Therefore, the lower electrode 252 may be connected to the first penetration via 120 through the connection pattern 240, the second connection via 260, the second via 334a, the second wiring pattern 332, and the third via 334b. In such a case, the lower electrode 252 of the capacitor structure 250 may be electrically connected to a package substrate (e.g., 20 of FIG. 8) or the like on which the interposer structure 10 is mounted.

The first conductive pad 410 may be formed below the wiring structure 300. The first conductive pad 410 may be exposed on a bottom surface of the wiring structure 300. The first conductive pad 410 may be connected to a plurality of penetration vias. For example, the first conductive pad 410 may be connected to the bottom surface of the first penetration via 120. The first conductive pad 410 may be mounted on a package substrate (e.g., 30 or 40 of FIG. 8) which will be described below.

The second conductive pad 420 may be formed on the wiring structure 300. The second conductive pad 420 may be exposed on the top surface of the wiring structure 300. The second conductive pad 420 may be connected to at least a part of the wiring structure 300. For example, the second conductive pad 420 may be connected to a plurality of wiring patterns 322 and 332 and/or a plurality of vias 324a, 334a, 334b and 344. A semiconductor chip (e.g., 30 or 40 of FIG. 8) to be described below may be mounted on the second conductive pad 420.

In the interposer structure 10 according to some embodiments, the capacitor structure 250 may be interposed between the interposer substrate 100 serving as a support substrate and the wiring structure 300 for implementing the redistribution. Since the capacitor structure 250 may be formed widely in a region between the interposer substrate 100 and the wiring structure 300, it is possible to increase an area in which the capacitor is implemented.

For example, the capacitor structure 250 may have an area wider than the top surface of the redistribution layer on which a semiconductor chip (e.g., 30 or 40 of FIG. 8) is mounted or a capacitor formed inside the redistribution layer (e.g., the wiring structure 300. Thus, an interposer structure including a capacitor with improved capacitance can be provided.

Figure 3:
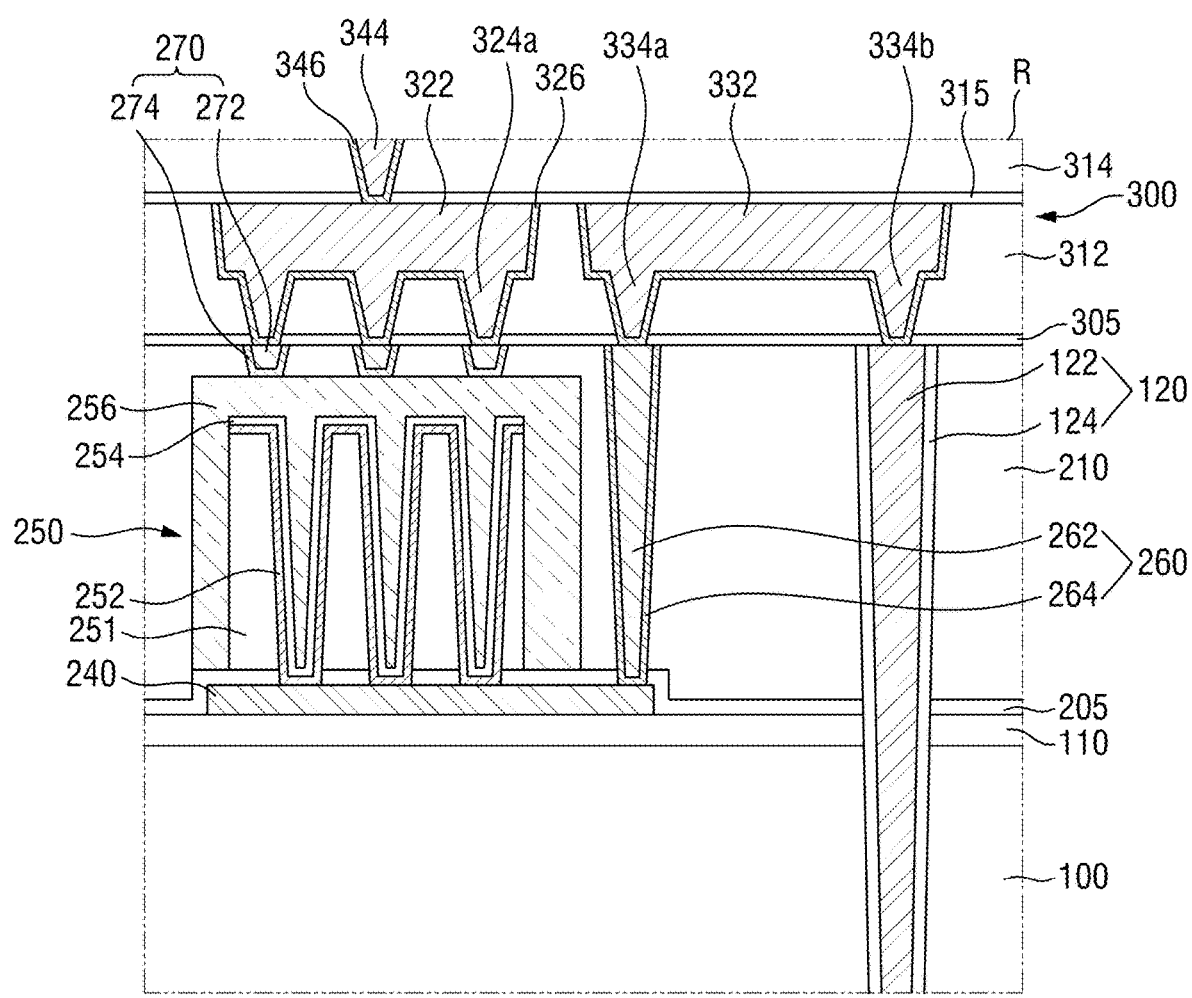

Referring to FIGS. 1 and 3, in the interposer structure 10 according to some embodiments, the capacitor structure 250 may further include a support insulating film 251.

The support insulating film 251 may be formed on the connection pattern 240. For example, the support insulating film 251 may be formed on the first etching prevention film 205 on the connection pattern 240.

The support insulating film 251 may support the lower electrode 252. For example, the support insulating film 251 may include a plurality of trenches which exposes the top surface of the connection pattern 240. The lower electrode 252 may extend along a bottom surface and a side surface of the trench of the support insulating film 251. For example, the lower electrode 252 including a plurality of cylinder structures may be formed in the trench of the support insulating film 251. The support insulating film 251 may include, for example, but is not limited to, silicon oxide.

Since the capacitor dielectric film 254 may extend along the profile of the lower electrode 252, the capacitor dielectric film 254 extends along the bottom surface and the side surface of the trench of the support insulating film 251.

In some embodiments, at least a part of the lower electrode 252 may extend along a top surface of the support insulating film 251. Since the capacitor dielectric film 254 may extend along the profile of the lower electrode 252, at least a part of the capacitor dielectric film 254 may extend along the bottom surface and the side surface of the trench of the support insulating film 251.

In some embodiments, the upper electrode 256 may cover the side surface of the support insulating film 251.

Figure 4:
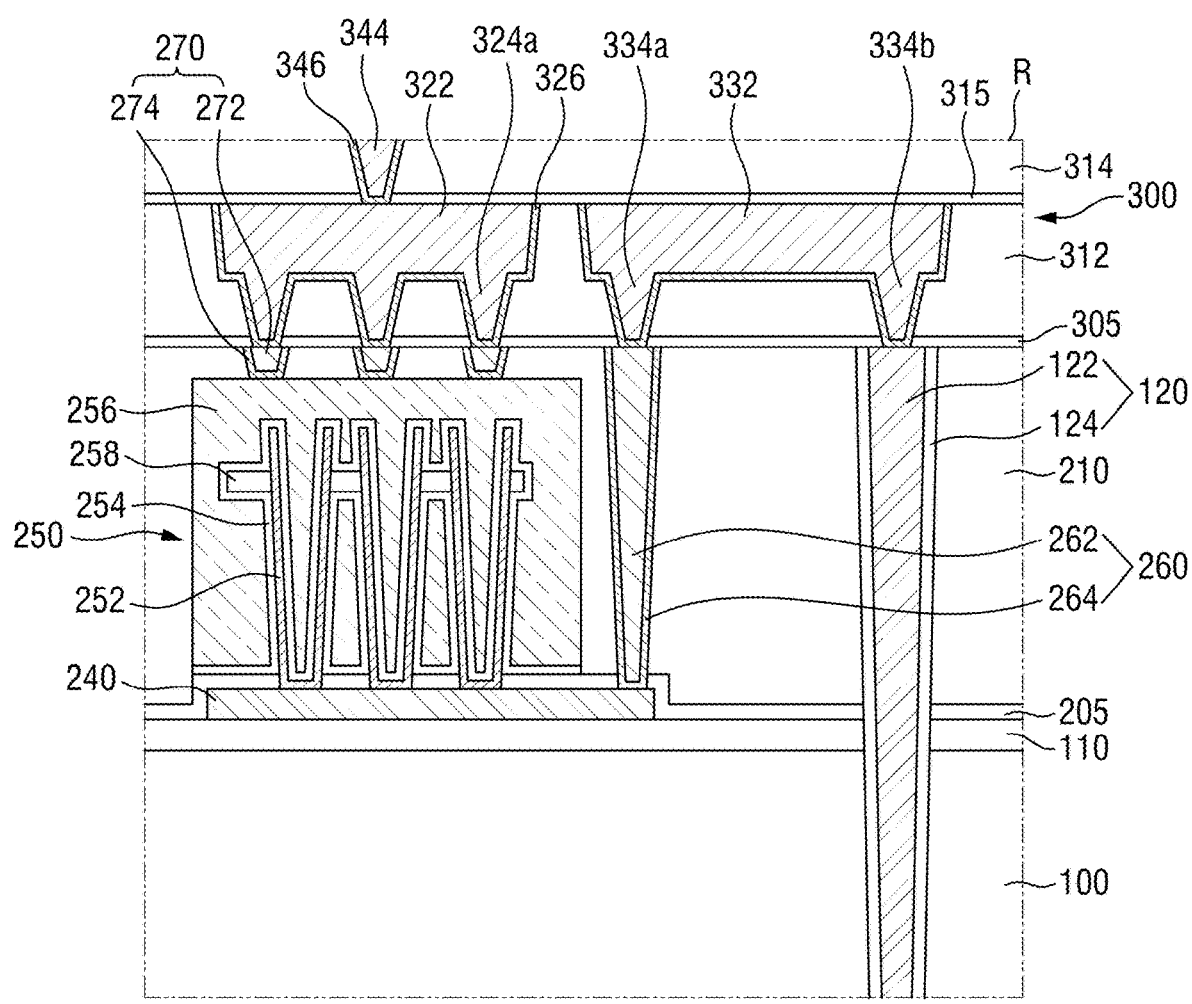

Referring to FIGS. 1 and 4, in the interposer structure 10 according to some embodiments, the capacitor structure 250 may further include a support pattern 258.

The support pattern 258 may be formed on a side surface of the lower electrode 252. The support pattern 258 may be spaced apart from the bottom surface of the lower electrode 252.

The support pattern 258 may support the side surface of the lower electrode 252. For example, the support pattern 258 may connect and support the adjacent side surfaces of the cylinder structure forming the lower electrode 252. The support pattern 258 may reduce or prevent a leaning phenomenon or a bending phenomenon of the lower electrode 252 having a high aspect ratio (AR). In some embodiments, the support pattern 258 may come into contact with the side surface of the lower electrode 252.

The support pattern 258 may include, for example, but is not limited to, silicon nitride.

In some embodiments, the capacitor dielectric film 254 may extend along the profile of the lower electrode 252 and the support pattern 258. Also, in some embodiments, the upper electrode 256 may cover the support pattern 258.

Figure 5:
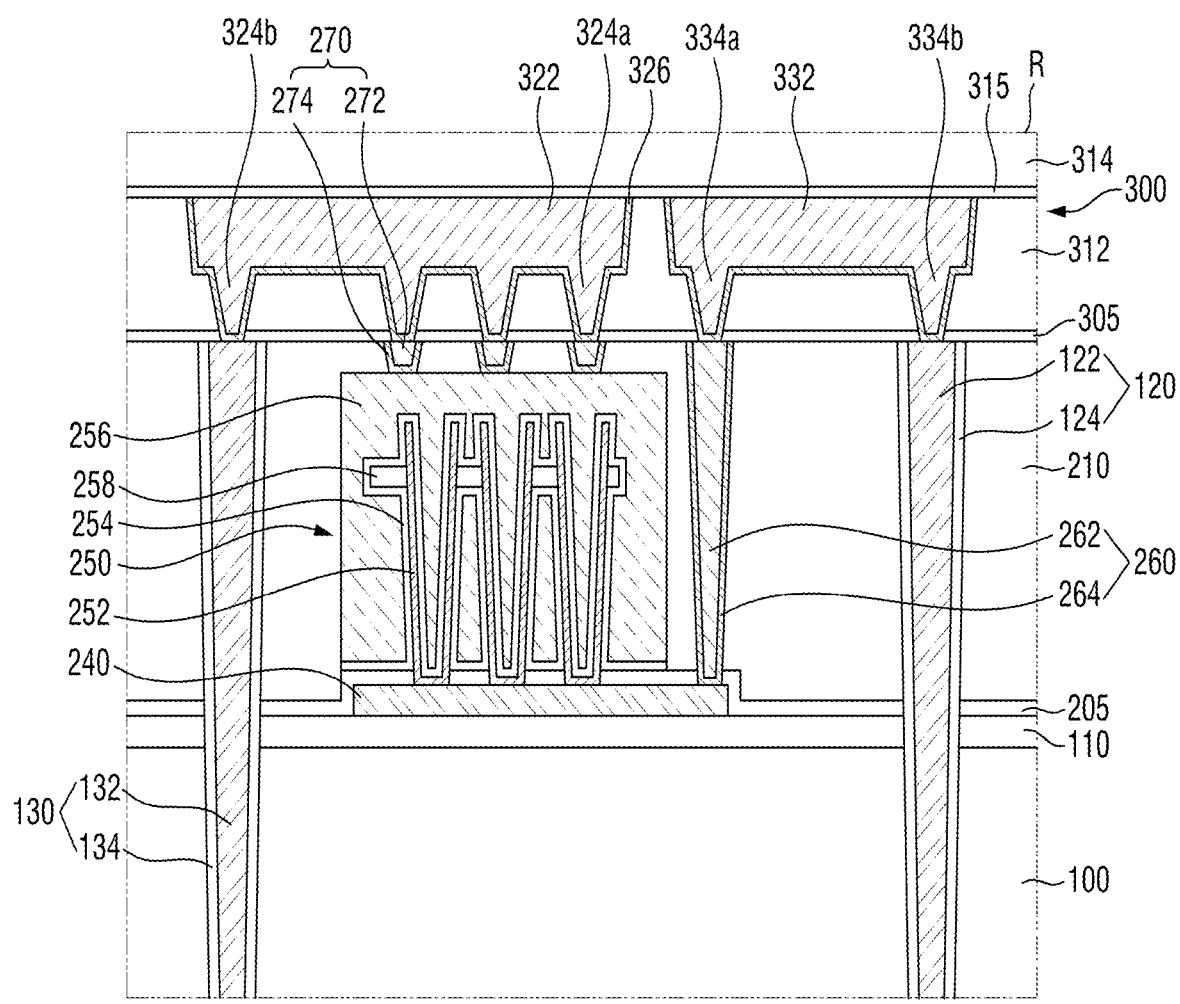

Referring to FIGS. 1 and 5, the interposer structure 10 according to some embodiments may further include a second penetration via 130.

The second penetration via 130 may be another penetration via among a plurality of penetration vias that penetrates the interposer substrate 100 and the first interlayer insulating film 210. That is, the second penetration via 130 may be spaced apart from the first penetration via 120. Although the capacitor structure 250 is shown as being interposed between the first penetration via 120 and the second penetration via 130, this is only for convenience of explanation, and the arrangement of the first penetration via 120 and the second penetration via 130 may, of course, be free.

In some embodiments, the second penetration via 130 may include a second conductive plug 132 and a second insulating spacer 134. The second conductive plug 132 may extend in a direction perpendicular to the top surface of the interposer substrate 100 and may penetrate the interposer substrate 100 and the second interlayer insulating film 312. The second insulating spacer 134 may extend along a side surface of the second conductive plug 132. Therefore, the second conductive plug 132 may be insulated from the interposer substrate 100.

In some embodiments, the first penetration via 120 and the second penetration via 130 may be formed at the same level. For example, the first penetration via 120 and the second penetration via 130 may be formed of the same material configuration (e.g., copper (Cu)).

In some embodiments, the second penetration via 130 may be electrically connected to the capacitor structure 250. For example, the first penetration via 120 may be connected to the lower electrode 252, and the second penetration via 130 may be connected to the upper electrode 256.

In some embodiments, the wiring structure 300 may further include a fifth via 324b in the second interlayer insulating film 312. The fifth via 324b may extend from a bottom surface of the first wiring pattern 322. The second penetration via 130 may penetrate the first interlayer insulating film 210 and be connected to the bottom surface of the fifth via 324b. Therefore, the upper electrode 256 may be connected to the second penetration via 130 through the first connection via 270, the first via 324a, the first wiring pattern 322, and the fifth via 324b. In such a case, the upper electrode 256 of the capacitor structure 250 may be electrically connected to a package substrate (e.g., 20 of FIG. 8) on which the interposer structure 10 is mounted.

Figure 6:
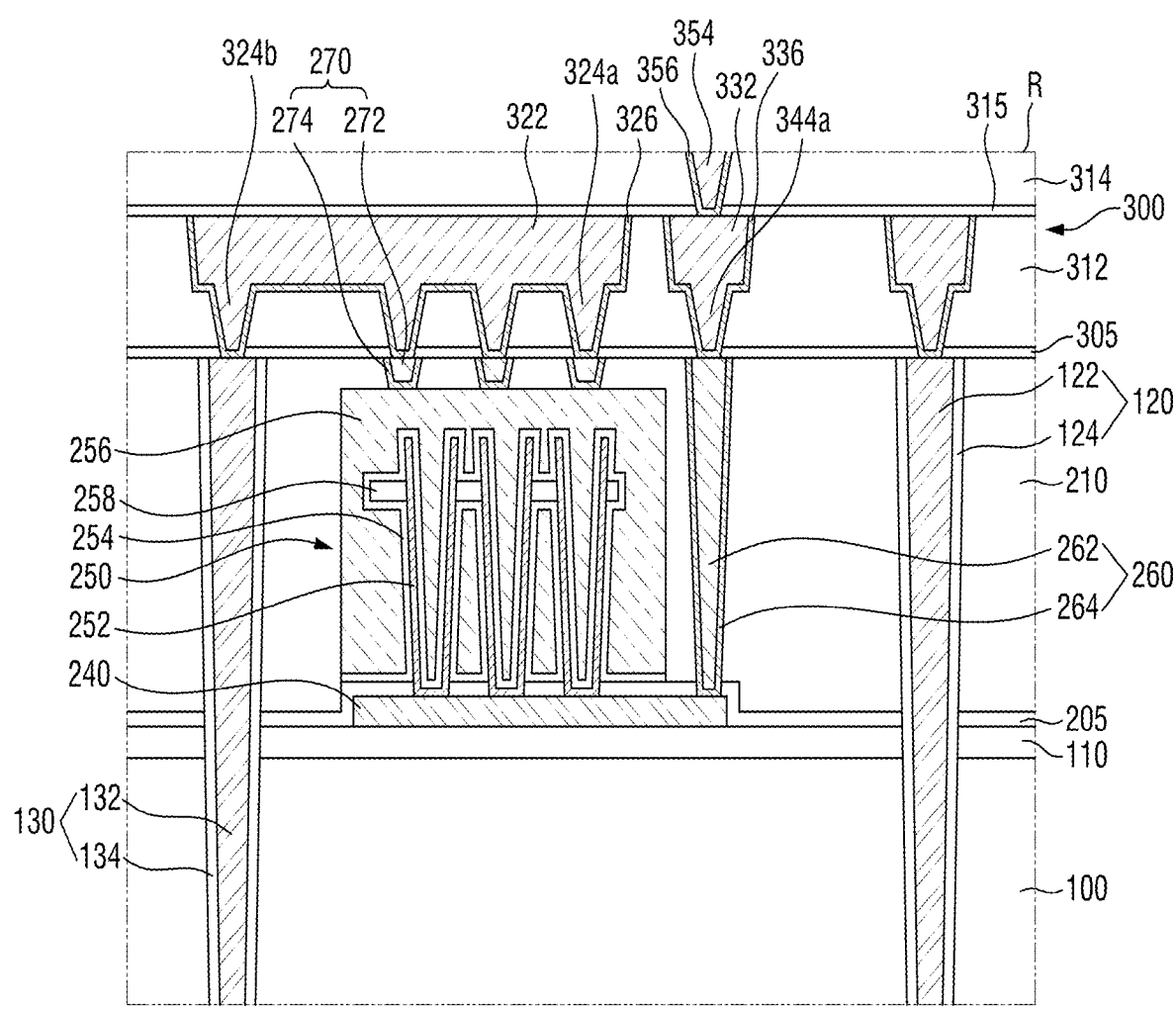

Referring to FIGS. 1 and 6, in the interposer structure 10 according to some embodiments, the lower electrode 252 may not be connected to the first penetration via 120.

For example, the second wiring pattern 332 connected to the second connection via 260 may not be connected to the first penetration via 120.

In some embodiments, the wiring structure 300 may further include a sixth via 354 in the third interlayer insulating film 314. The sixth via 354 may be formed on the second wiring pattern 332. The sixth via 354 may penetrate the third etching prevention film 315 and be connected to the top surface of the second wiring pattern 332. Thus, the lower electrode 252 may be connected to the sixth via 354 through the second connection via 260, the second via 334a, and the second wiring pattern 332. In such a case, the lower electrode 252 of the capacitor structure 250 may be electrically connected to a semiconductor chip (e.g., 30 or 40 of FIG. 8) or the like mounted on the interposer structure 10.

In some embodiments, the wiring structure 300 may further include a sixth barrier layer 356 in the third interlayer insulating film 314. The sixth barrier layer 356 may extend along a bottom surface and a side surface of the sixth via 354. The sixth barrier layer 356 may reduce or prevent diffusion the elements included in the sixth via 354.

Figure 7:
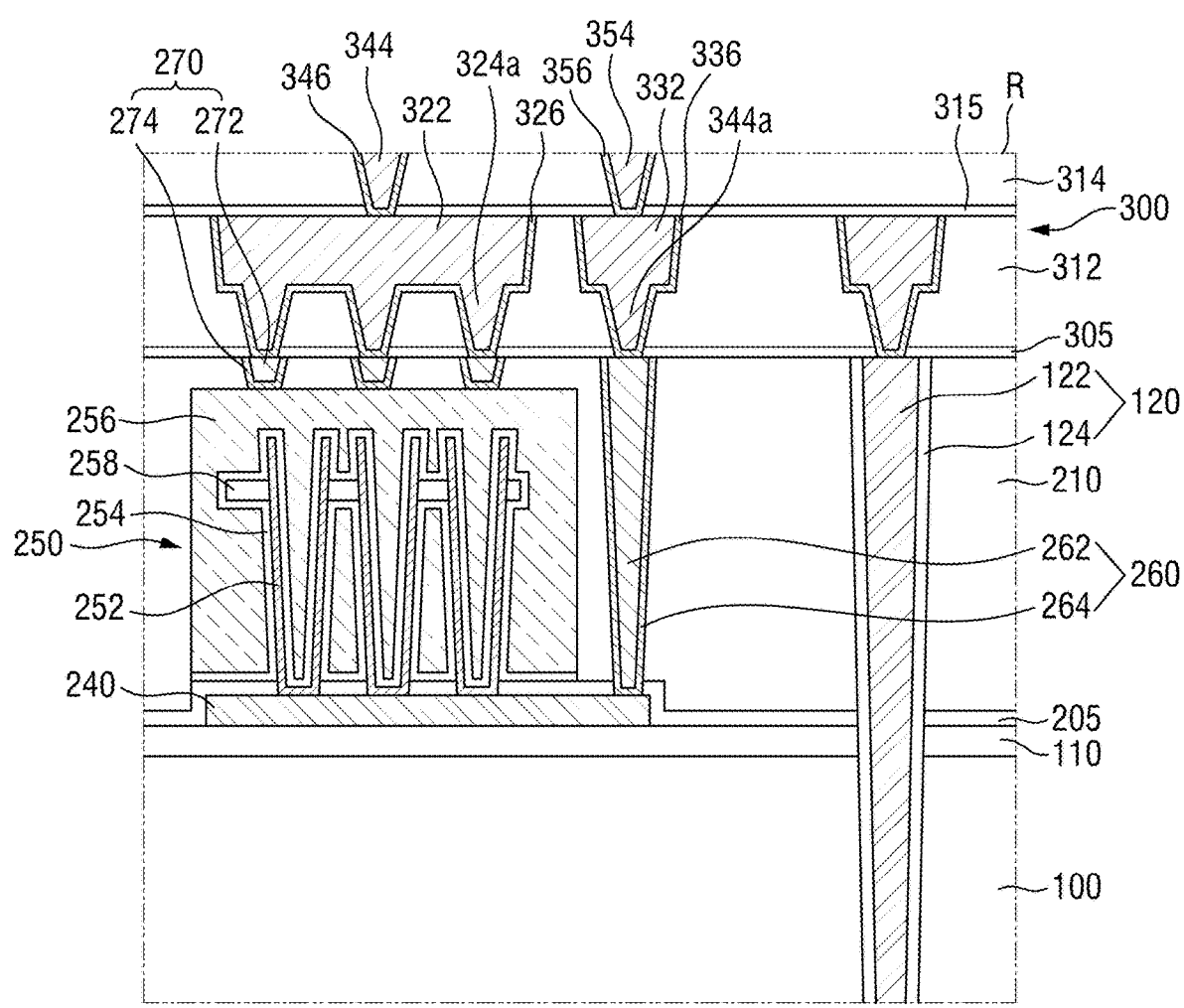

Referring to FIGS. 1 and 7, in the interposer structure 10 according to some embodiments, the upper electrode 256 may not be connected to the second penetration via 130.

For example, the first wiring pattern 322 connected to the first connection via 270 may not be connected to the second penetration via 130.

In some embodiments, the upper electrode 256 may be connected to the fourth via 344 through the first connection via 270, the first via 324a, and the first wiring pattern 322. In such a case, the lower electrode 252 of the capacitor structure 250 may be electrically connected to a semiconductor chip (e.g., 30 or 40 of FIG. 8) mounted on the interposer structure 10.

Figure 8:
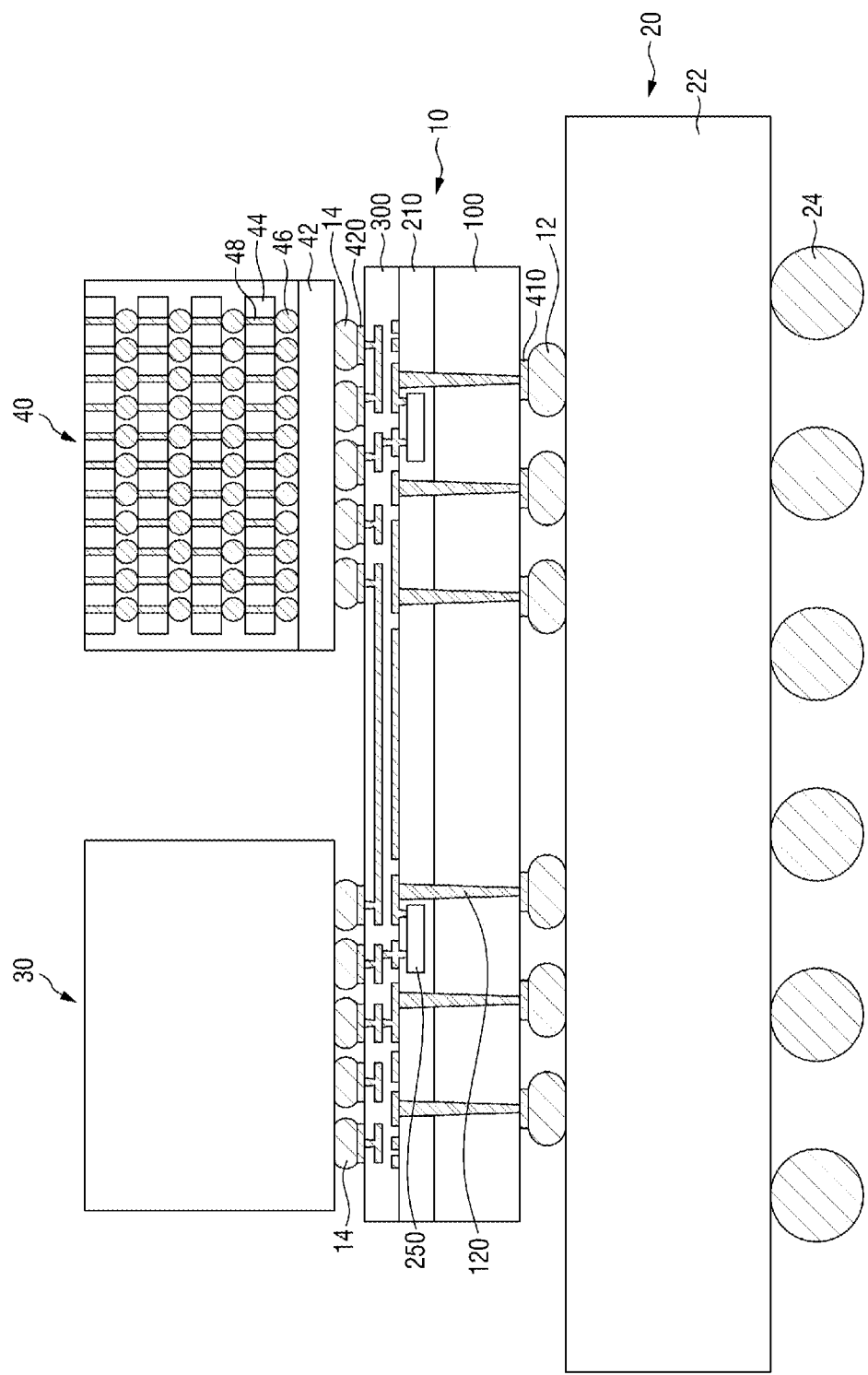
FIG. 8 is a schematic cross-sectional view for explaining the semiconductor package according to some embodiments.

FIG. 8 is a schematic cross-sectional view for explaining the semiconductor package according to some embodiments. For the sake of convenience of description, repeated parts of contents described above using FIGS. 1 to 7 will be briefly described or omitted.

Referring to FIG. 8, the semiconductor package according to some embodiments includes an interposer structure 10, a package substrate 20, a first semiconductor chip 30 and/or a second semiconductor chip 40.

The package substrate 20 may function as a support substrate of the semiconductor package. The package substrate 20 may be, for example, but not limited to, a printed circuit substrate, (PCB) a ceramic substrate or the like.

The interposer structure 10 may be mounted on the package substrate 20. For example, a plurality of first solders 12 may be formed on the top surface of the package substrate 20. The first solders 12 may be connected to the first conductive pad 410 of the interposer structure 10. Therefore, the interposer structure 10 may be electrically connected to the package substrate 20. The first solders 12 may have, but are not limited to, a spherical or ball shape.

The first semiconductor chip 30 and the second semiconductor chip 40 may be mounted on the interposer structure 10. For example, a plurality of second solders 14 may be formed on the second conductive pads 420. The second solders 14 may be connected to the first semiconductor chip 30 or the second semiconductor chip 40. Therefore, the interposer structure 10 may be electrically connected to the first semiconductor chip 30 or the second semiconductor chip 40. The second solders 14 may have, but are not limited to, a spherical or ball shape.

In some embodiments, at least a part of the wiring structure 300 may connect the first semiconductor chip 30 and the second semiconductor chip 40.

In some embodiments, the first semiconductor chip 30 may be a logic semiconductor chip. For example, the first semiconductor chip 30 may be, but is not limited to, an application processor (AP) such as a CPU (Central Processing Unit), a GPU (Graphic Processing Unit), an FPGA (Field-Programmable Gate Array), a digital signal processor, an encryption processor, a microprocessor, a microcontroller, and an ASIC (Application-Specific IC).

In some embodiments, the second semiconductor chip 40 may be a memory semiconductor chip. For example, the second semiconductor chip 40 may be a volatile memory such as a DRAM (dynamic random access memory) or a SRAM (static random access memory), or may be a non-volatile memory such as a flash memory, a PRAM (phase-change random access memory), a MRAM (magnetoresistive random access memory), a FeRAM (ferroelectric random access memory) or a RRAM (resistive random access memory).

For example, the second semiconductor chip 40 may include a chip substrate 42, a semiconductor substrate 44, a connection bump 46, and/or a third penetration via 48. A plurality of semiconductor substrates 44 may be stacked on the chip substrates 42. The connection bump 46 may completely connect between the chip substrate 42 and the semiconductor substrate 44, and between the semiconductor substrates 44. The third penetration via 48 may penetrate the semiconductor substrate 44 and be connected to the connection bump 46.

In some embodiments, a plurality of third solder balls 24 may be formed on the bottom surface of the package substrate 20. The third solders 24 may mount the package substrate 20 on a main board (not shown) of an electronic device or the like. Accordingly, the semiconductor package according to some embodiments may be mounted on the electronic device.

Hereinafter, a method for fabricating an interposer structure according to some embodiments will be described with reference to FIGS. 1 through 26. For reference, FIGS. 9 to 26 are enlarged views corresponding to the region R of FIG. 1.

FIGS. 9 to 18 are intermediate stage diagrams for explaining a method for fabricating an interposer structure according to some embodiments. For the sake of convenience of description, repeated parts of contents described above using FIGS. 1 to 8 will be briefly described or omitted.

Figure 9:
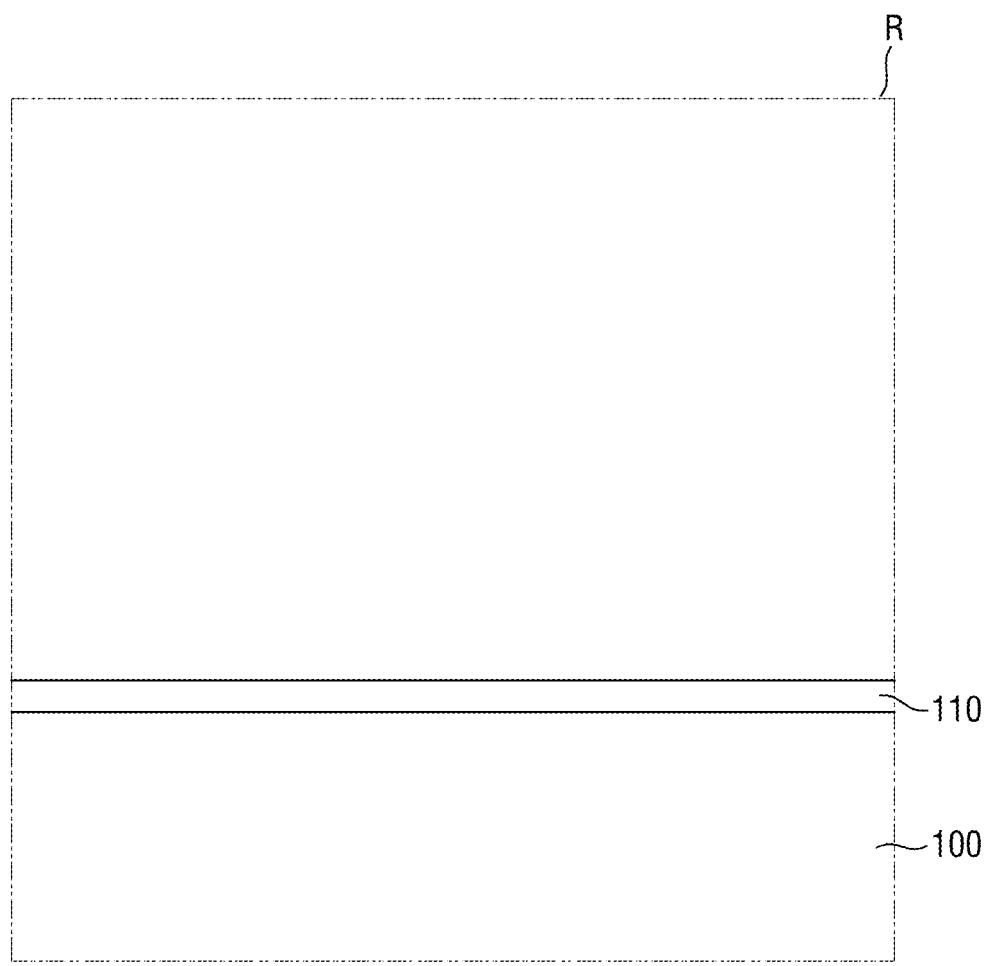
FIGS. 9 to 18 are intermediate stage diagrams for explaining a method for fabricating an interposer structure according to some embodiments.

Referring to FIG. 9, an interposer substrate 100 is provided.

The interposer substrate 100 may be a silicon substrate, a gallium arsenide substrate, a silicon germanium substrate, a ceramic substrate, a quartz substrate, a glass substrate, or the like, and may be an SOI (Semiconductor On Insulator) substrate. In the following description, the interposer substrate 100 will be described as a silicon substrate.

In some embodiments, a planarization insulating film 110 may be formed on the interposer substrate 100. The planarization insulating film 110 may extend along a top surface of the interposer substrate 100. The planarization insulating film 110 may include, for example, but is not limited to, silicon oxide.

Figure 10:
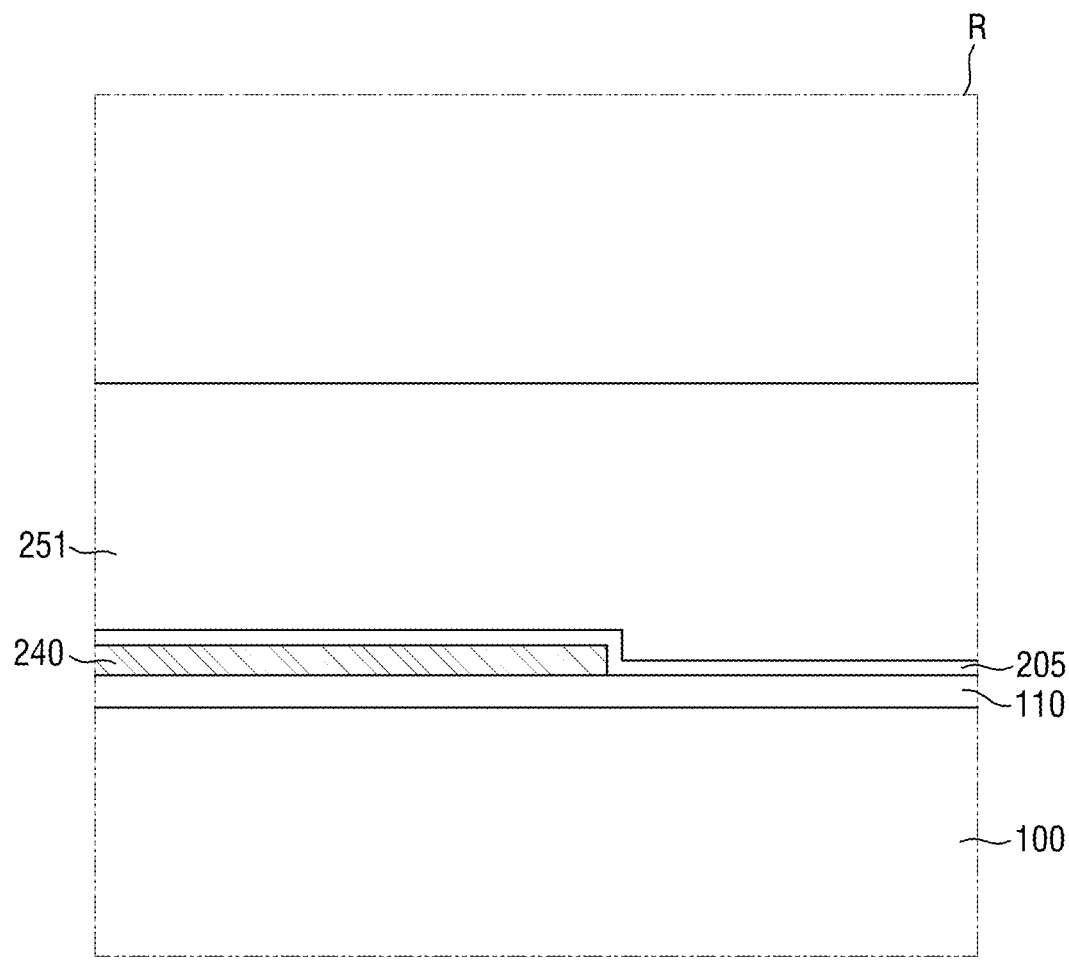

Referring to FIG. 10, a connection pattern 240, a first etching prevention film 205, and/or a support insulating film 251 are sequentially formed on the planarization insulating film 110.

The connection pattern 240 may extend along a part of the top surface of the planarization insulating film 110. The connection pattern 240 may include a conductive material. For example, a conductive film may be formed on the top surface of the planarization insulating film 110, and the conductive film may be patterned to form a connection pattern 240.

The first etching prevention film 205 may conformally extend along the top surface of the planarization insulating film 110 and the top surface of the connection pattern 240. The first etching prevention film 205 may include, for example, but is not limited to, silicon nitride.

The support insulating film 251 may be formed on the first etching prevention film 205. The support insulating film 251 may be formed to cover the first etching prevention film 205.

Figure 11:
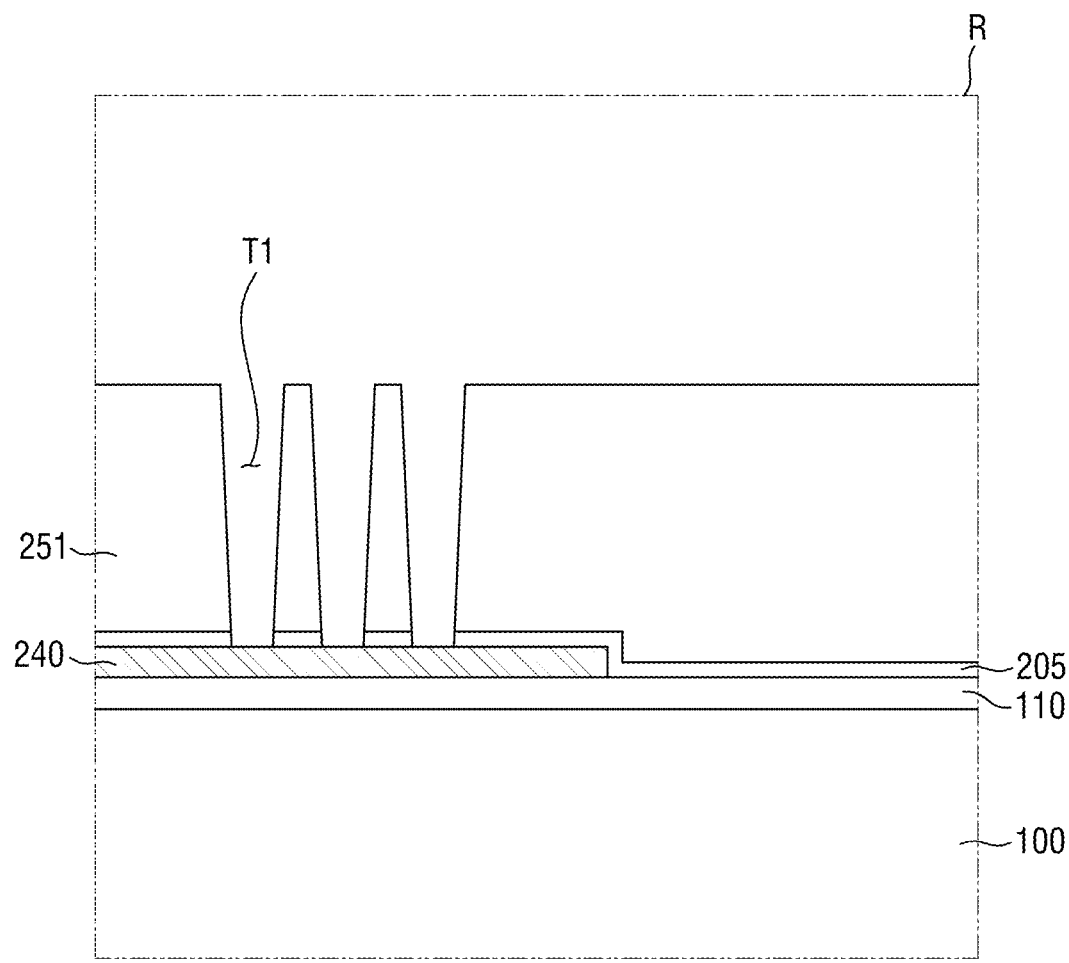

Referring to FIG. 11, a first trench T1 is formed in the support insulating film 251.

The first trench T1 may expose a part of the top surface of the connection pattern 240. For example, an etching process of penetrating the support insulating film 251 and the first etching prevention film 205 to expose the top surface of the connection pattern 240 may be performed.

In some embodiments, the width of the first trench T1 may increase as it goes away from the top surface of the interposer substrate 100. This may be attributed to the characteristics of the etching process for forming the first trench T1.

In some embodiments, a plurality of first trenches T1 may be formed in the support insulating film 251.

Figure 12:
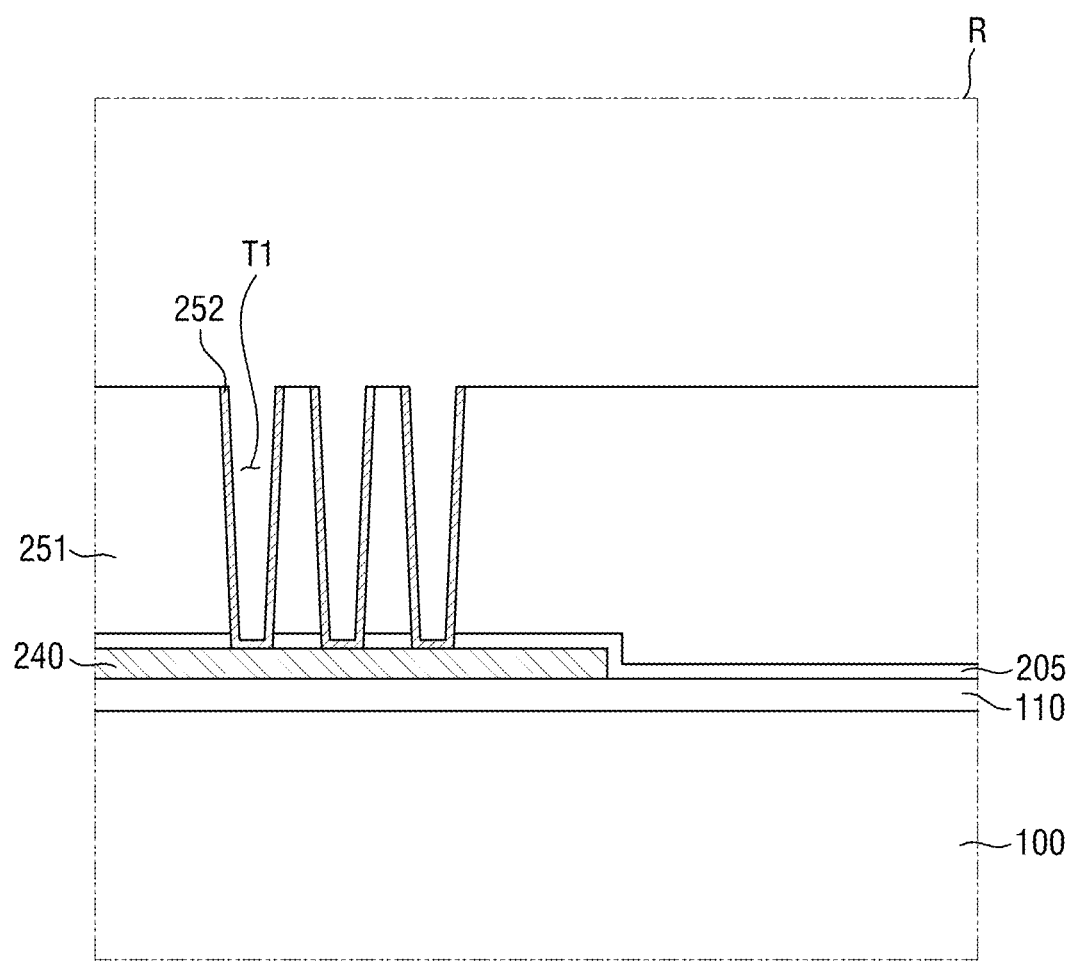

Referring to FIG. 12, a lower electrode 252 is formed in the first trench T1.

For example, a conductive film conformally extending on the support insulating film 251 may be formed. Subsequently, a part of the conductive film extending along the top surface of the support insulating film 251 may be removed. The removal of a part of the conductive film may be performed, but is not limited to, for example, by a planarization process such as a chemical mechanical polishing (CMP) process.

Accordingly, a lower electrode 252 extending along the bottom surface and the side surface of the first trench T1 may be formed. Since the first trench T1 may expose the top surface of the connection pattern 240, the bottom surface of the lower electrode 252 may be connected to the top surface of the connection pattern 240.

The lower electrode 252 may include, but is not limited to, at least one of titanium (Ti), titanium nitride (TiN), tantalum (Ta), tantalum nitride (TaN), tungsten nitride (WN), metal silicide, and a combination thereof.

Figure 13:
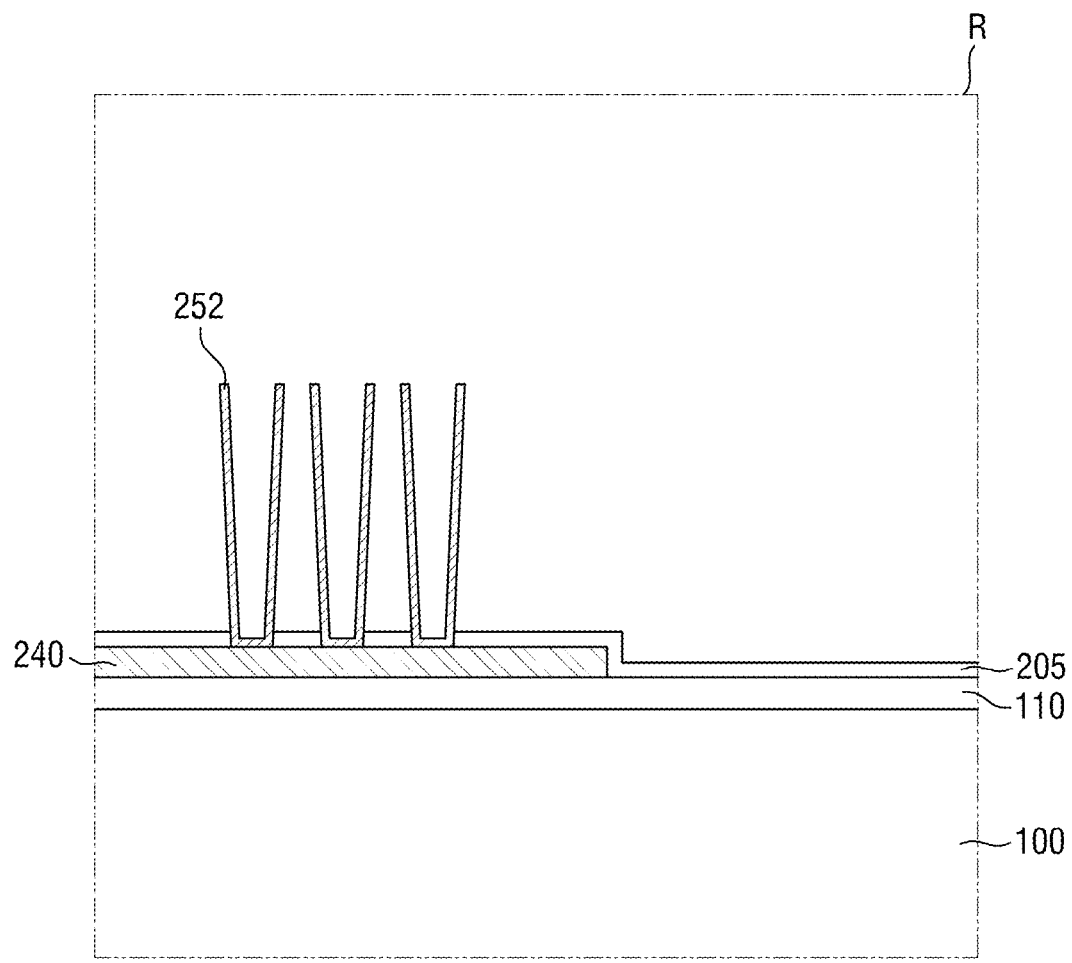

Referring to FIG. 13, the support insulating film 251 is removed.

Therefore, the lower electrode 252 having a shape protruding from the top surface of the connection pattern 240 in a direction intersecting the top surface of the connection pattern 240 may be formed.

In some embodiments, the lower electrode 252 may include a plurality of cylinder structures having bottom surfaces connected to the top surface of the connection pattern 240.

Figure 14:
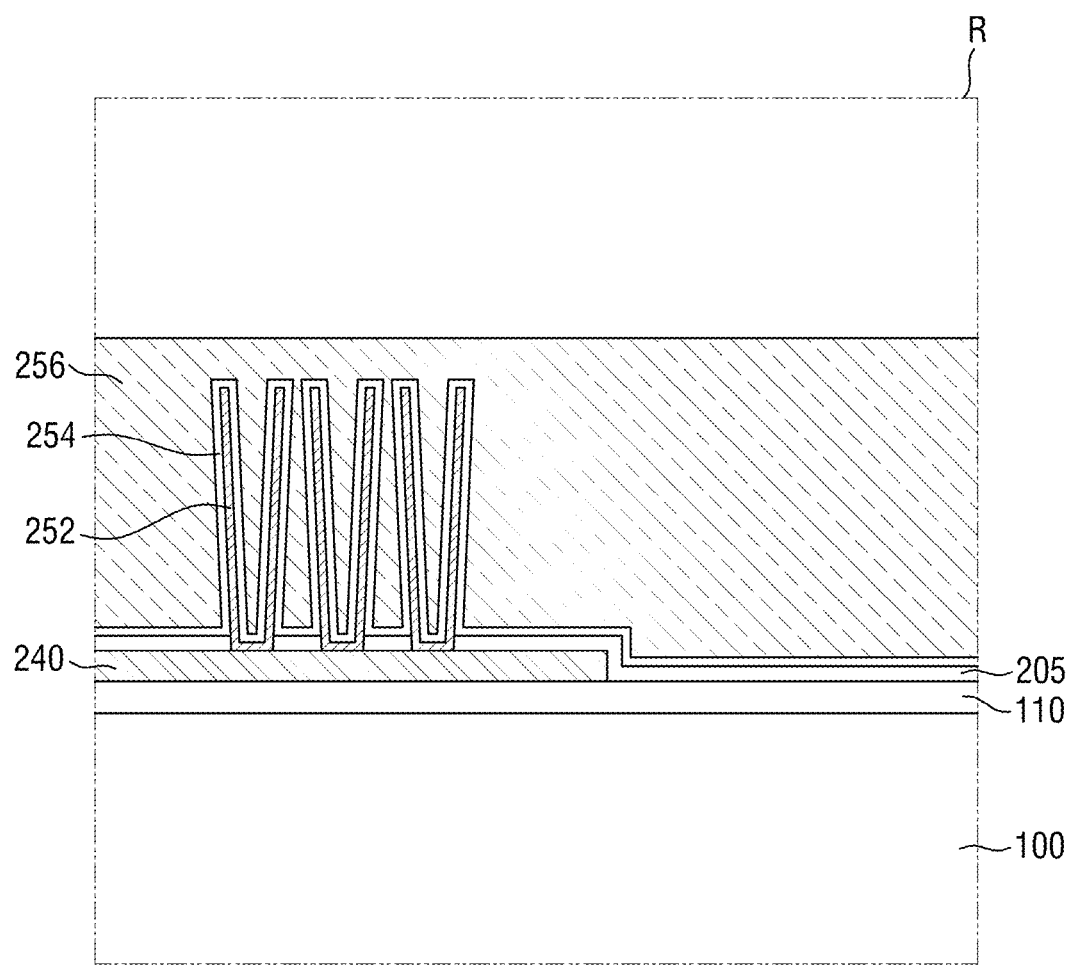

Referring to FIG. 14, a capacitor dielectric film 254 and an upper electrode 256 are sequentially formed on the lower electrode 252.

The capacitor dielectric film 254 may extend along the profile of the lower electrode 252. When the capacitor dielectric film 254 includes a plurality of cylinder structures, the capacitor dielectric film 254 may extend along the profiles of each of the cylinder structures.

The capacitor dielectric film 254 may include, for example, silicon oxide, silicon nitride, silicon oxynitride, and high-k materials having a dielectric constant higher than silicon oxide.

The upper electrode 256 may be formed on the capacitor dielectric film 254. The upper electrode 256 may cover the capacitor dielectric film 254.

The upper electrode 256 may include a conductive material. For example, the upper electrode 256 may include, but is not limited to, at least one of titanium (Ti), titanium nitride (TiN), tantalum (Ta), tantalum nitride (TaN), tungsten nitride (WN), metal silicide, and a combination thereof.

In some embodiments, the upper electrode 256 may include a semiconductor material such as polysilicon (poly Si) or silicon germanium (SiGe).

Figure 15:
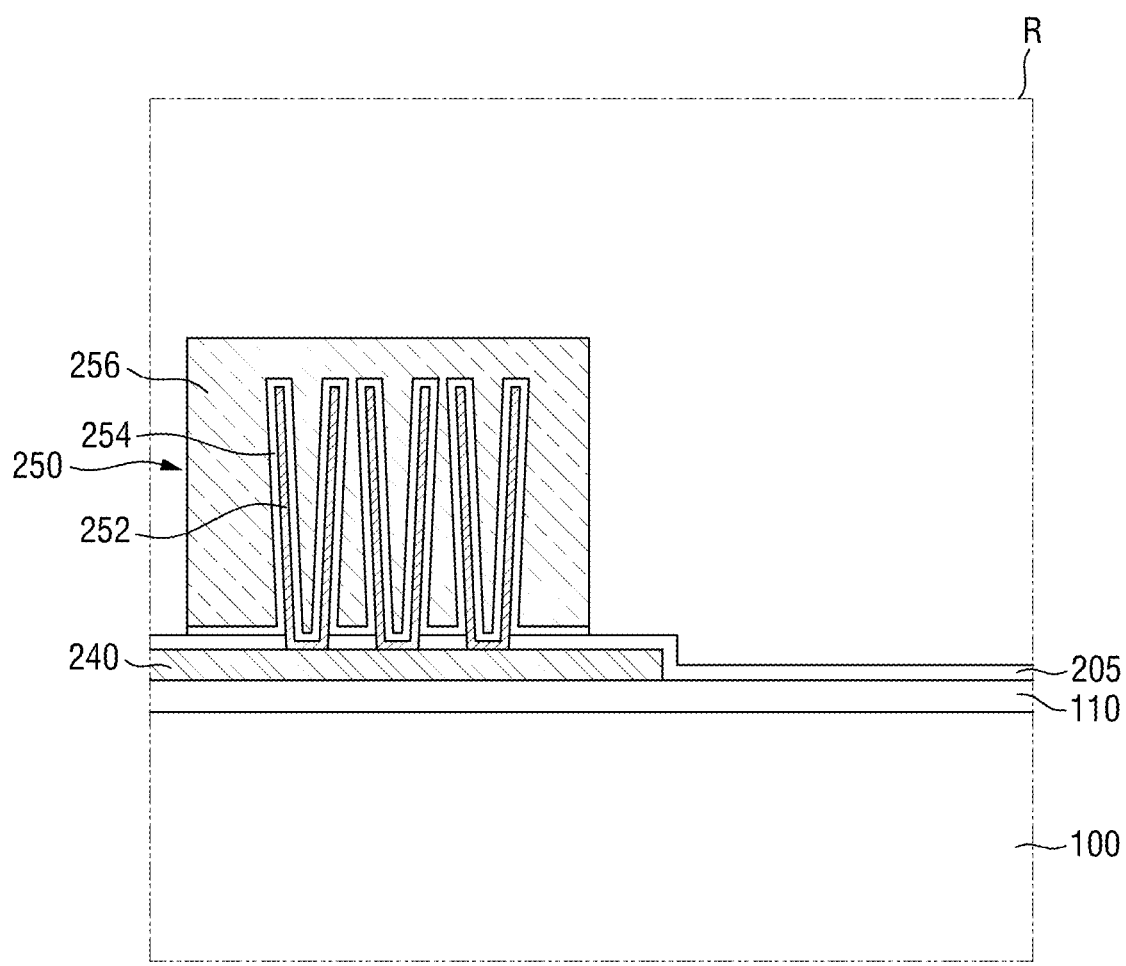

Referring to FIG. 15, the upper electrode 256 is patterned.

As a result, a capacitor structure 250 including the lower electrode 252, the capacitor dielectric film 254, and the upper electrode 256 may be formed.

In some embodiments, the upper electrode 256 may be patterned to expose a part of the top surface of the connection pattern 240. For example, a part of the connection patterns 240 may not overlap the upper electrode 256 patterned in a direction perpendicular to the top surface of the interposer substrate 100.

In some embodiments, the capacitor dielectric film 254 may be patterned together with the upper electrode 256.

In some embodiments, the first etching prevention film 205 may function as an etching prevention film of the etching process that patterns the upper electrode 256.

Figure 16:
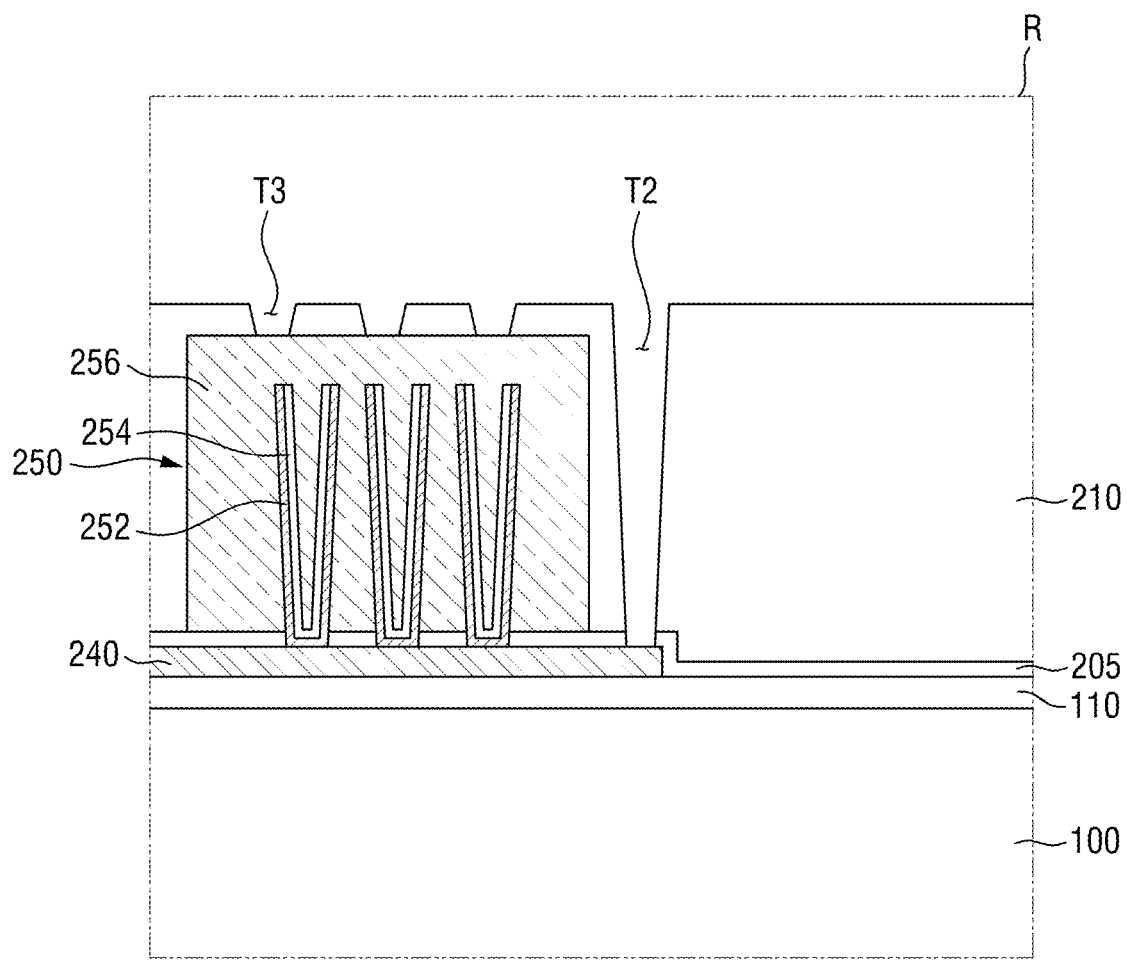

Referring to FIG. 16, a first interlayer insulating film 210 including a second trench T2 and a third trench T3 is formed.

For example, the first interlayer insulating film 210 which covers the first etching prevention film 205 and the capacitor structure 250 may be formed. The first interlayer insulating film 210 may include, for example, at least one of silicon oxide, silicon nitride, silicon oxynitride, and a low low-k material having a dielectric constant lower than silicon oxide.

Subsequently, the second trench T2 which exposes another part of the top surface of the connection pattern 240 may be formed. For example, an etching process of penetrating the first interlayer insulating film 210 to expose the top surface of the connection pattern 240 may be performed.

In addition, the third trench T3 which exposes a part of the top surface of the upper electrode 256 may be formed. For example, an etching process which penetrates the first interlayer insulating film 210 to expose the top surface of the upper electrode 256 may be performed.

In some embodiments, formation of the second trench T2 and the third trench T3 may be performed simultaneously. For example, the second trench T2 and the third trench T3 may be formed by the same etching process.

In some embodiments, the widths of the second trench T2 and the third trench T3 may increase as they go away from the top surface of the interposer substrate 100. This may be attributed to the characteristics of the etching process for forming the second trench T2 and the third trench T3.

Figure 17:
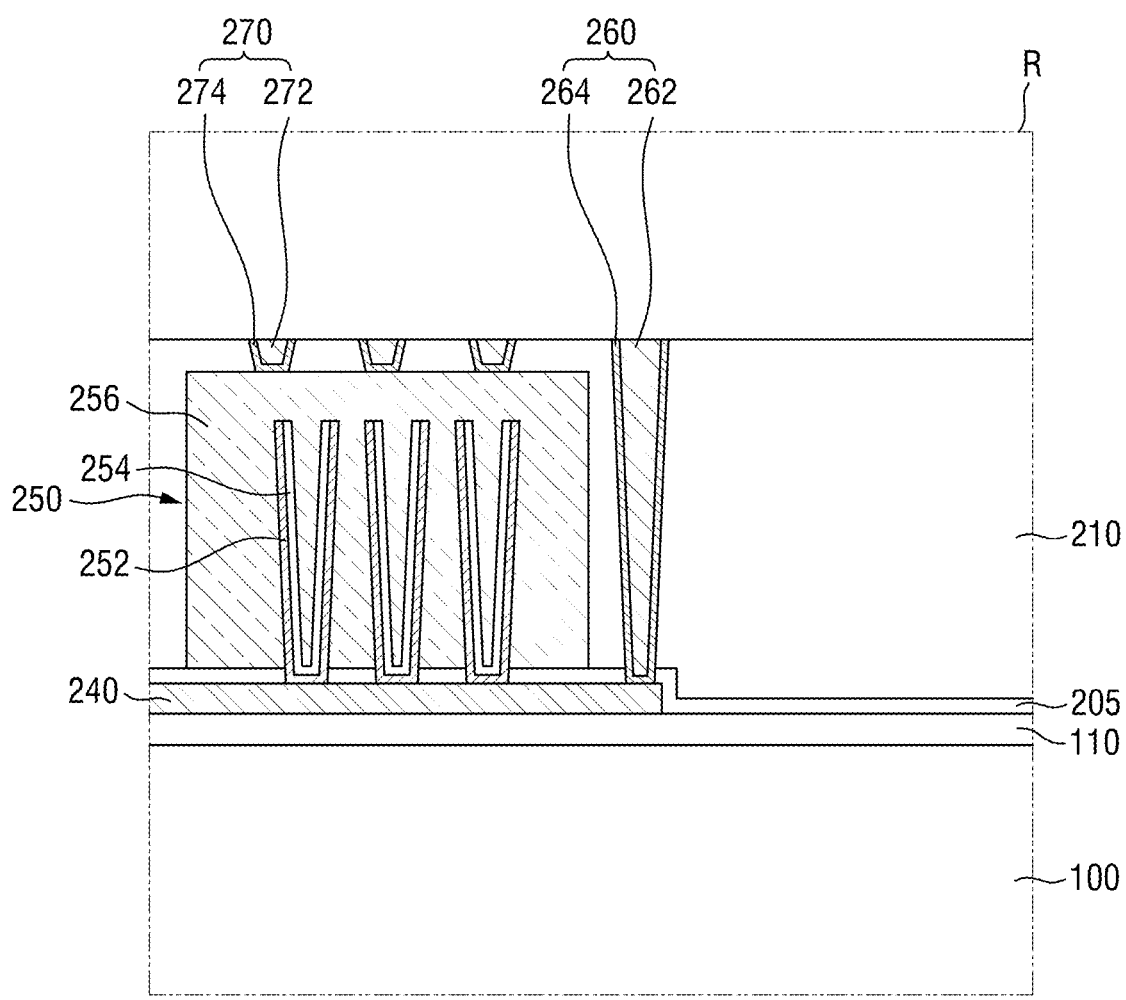

Referring to FIG. 17, a first connection via 270 and a second connection via 260 are formed.

For example, the first connection via 270 which fills the third trench T3 of FIG. 16 may be formed, and the second connection via 260 which fills the second trench T2 of FIG. 16 may be formed.

Therefore, the first connection via 270 may be connected to the top surface of the upper electrode 256, and the second connection via 260 may be connected to the top surface of the connection pattern 240.

In some embodiments, the first connection via 270 may include a first wiring pattern 322 and a fourth barrier layer 274, and the second connection via 260 may include a second wiring pattern 332 and a fifth barrier layer 264.

Figure 18:
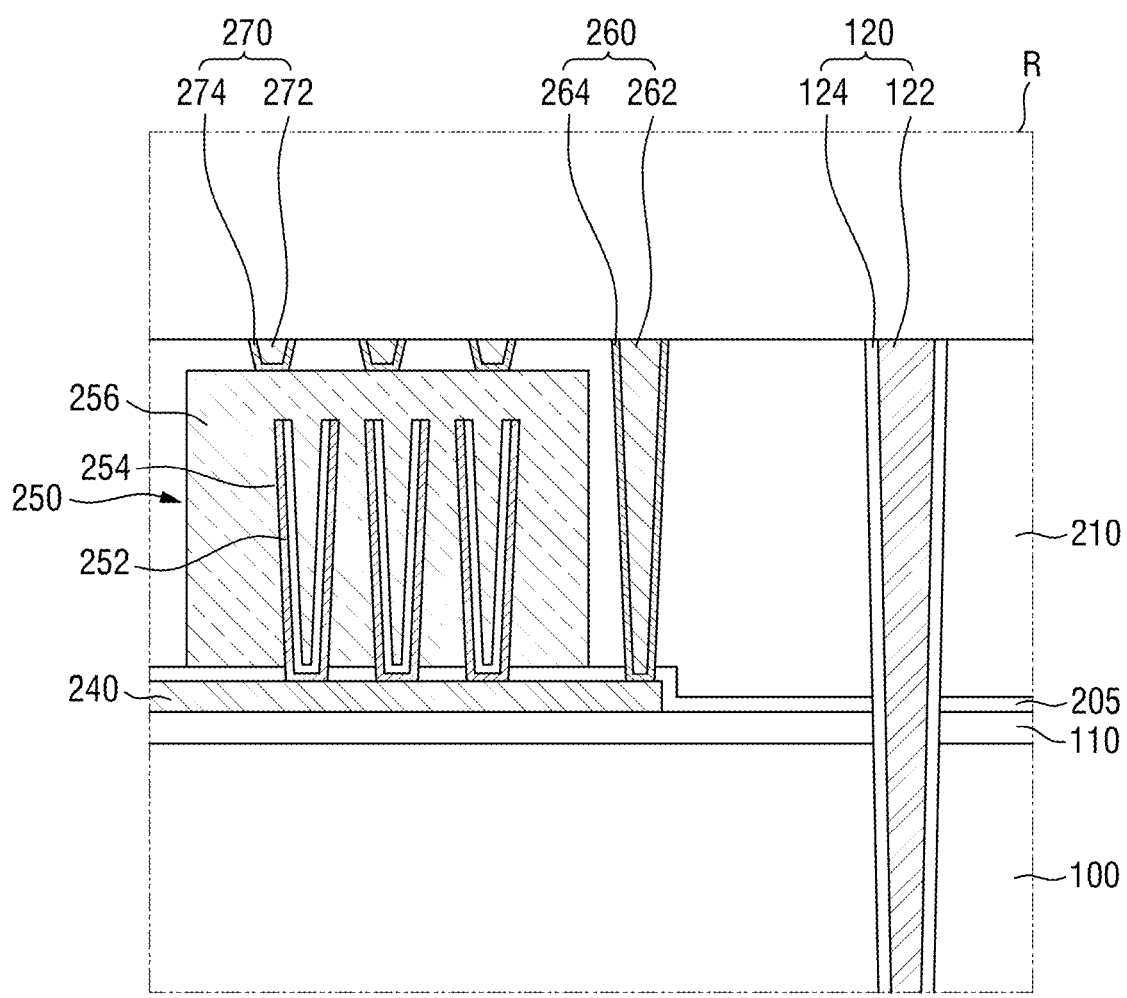

Referring to FIG. 18, a first penetration via 120 which penetrates the interposer substrate 100 and the first interlayer insulating film 210 is formed.

For example, a penetration hole which penetrates the interposer substrate 100 and the first interlayer insulating film 210 may be formed. Subsequently, the first penetration via 120 which fills the penetration hole may be formed.

In some embodiments, the first penetration via 120 may include a first conductive plug 122 and a first insulating spacer 124.

Figure 19:
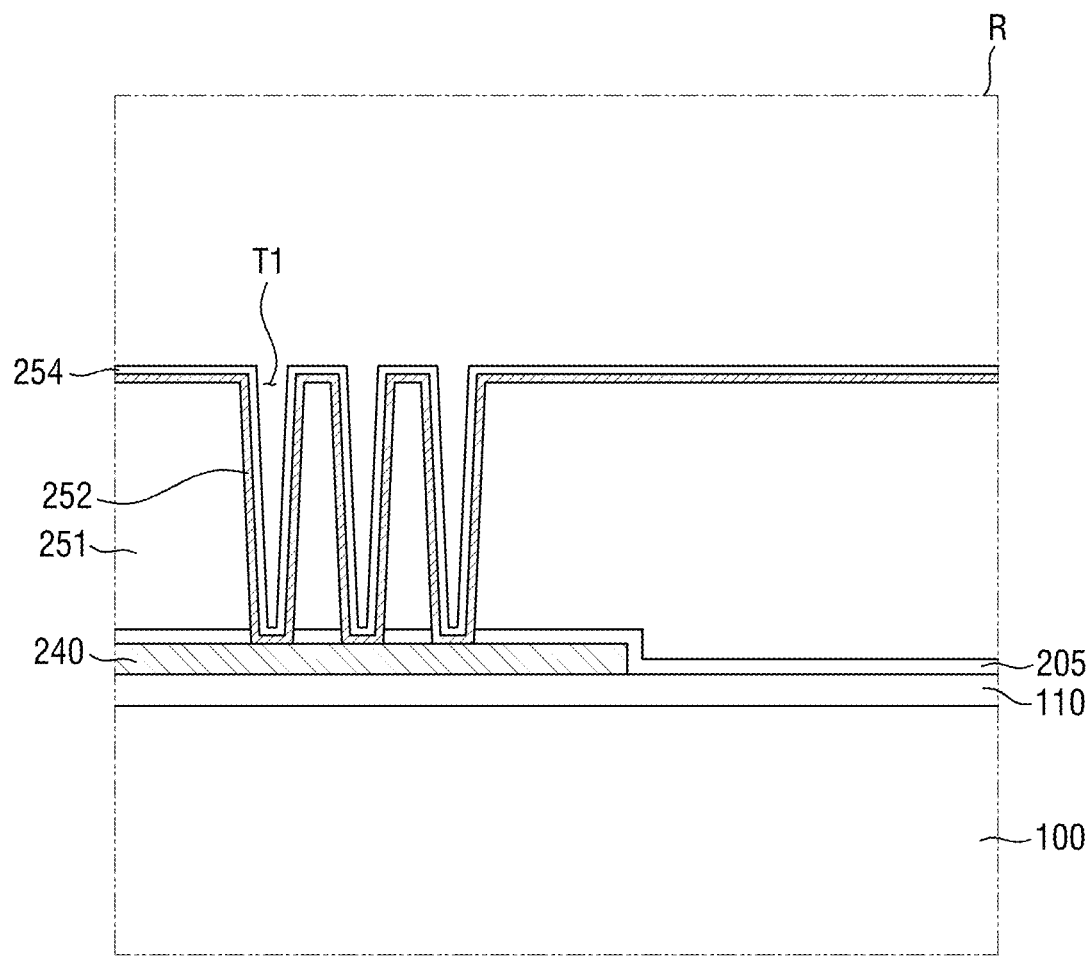
FIGS. 19 to 21 are intermediate stage diagrams showing a method for fabricating an interposer structure according to some embodiments.
Figure 20:
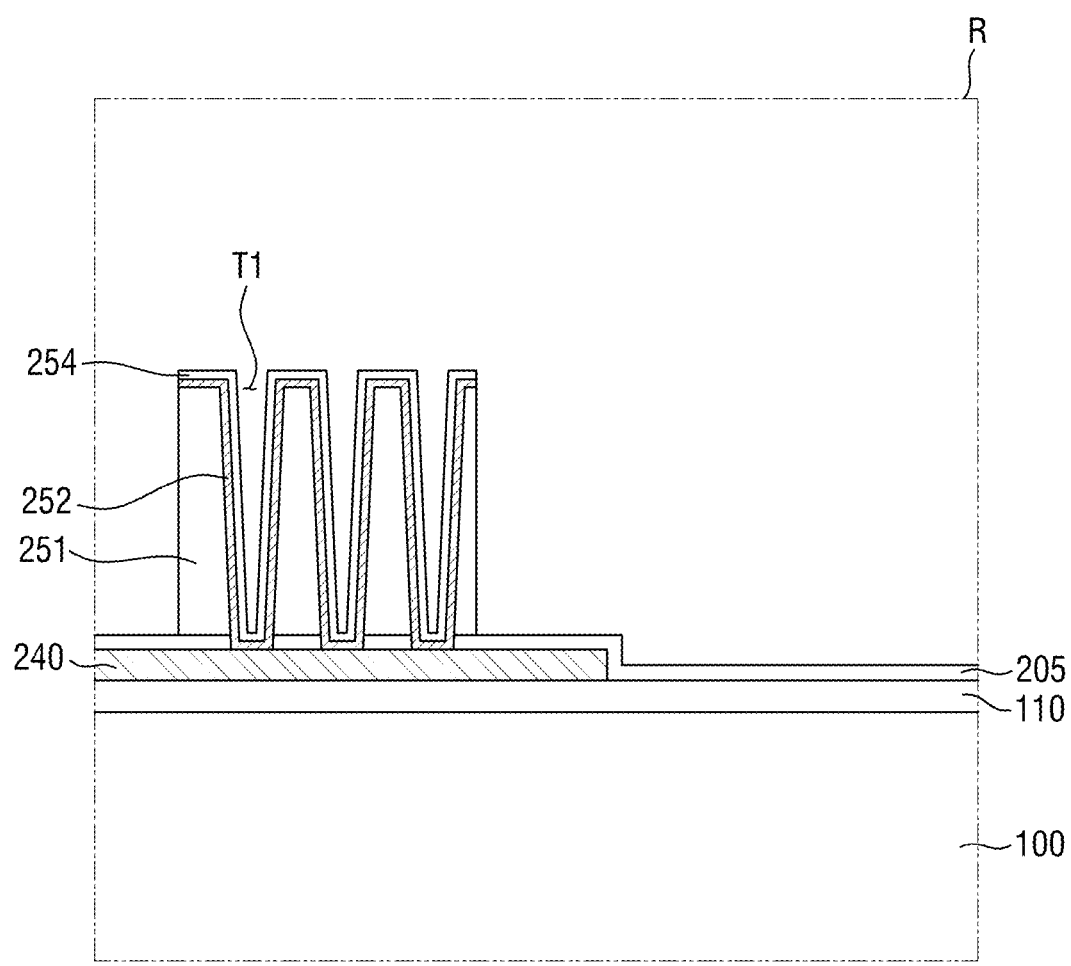
Figure 21:
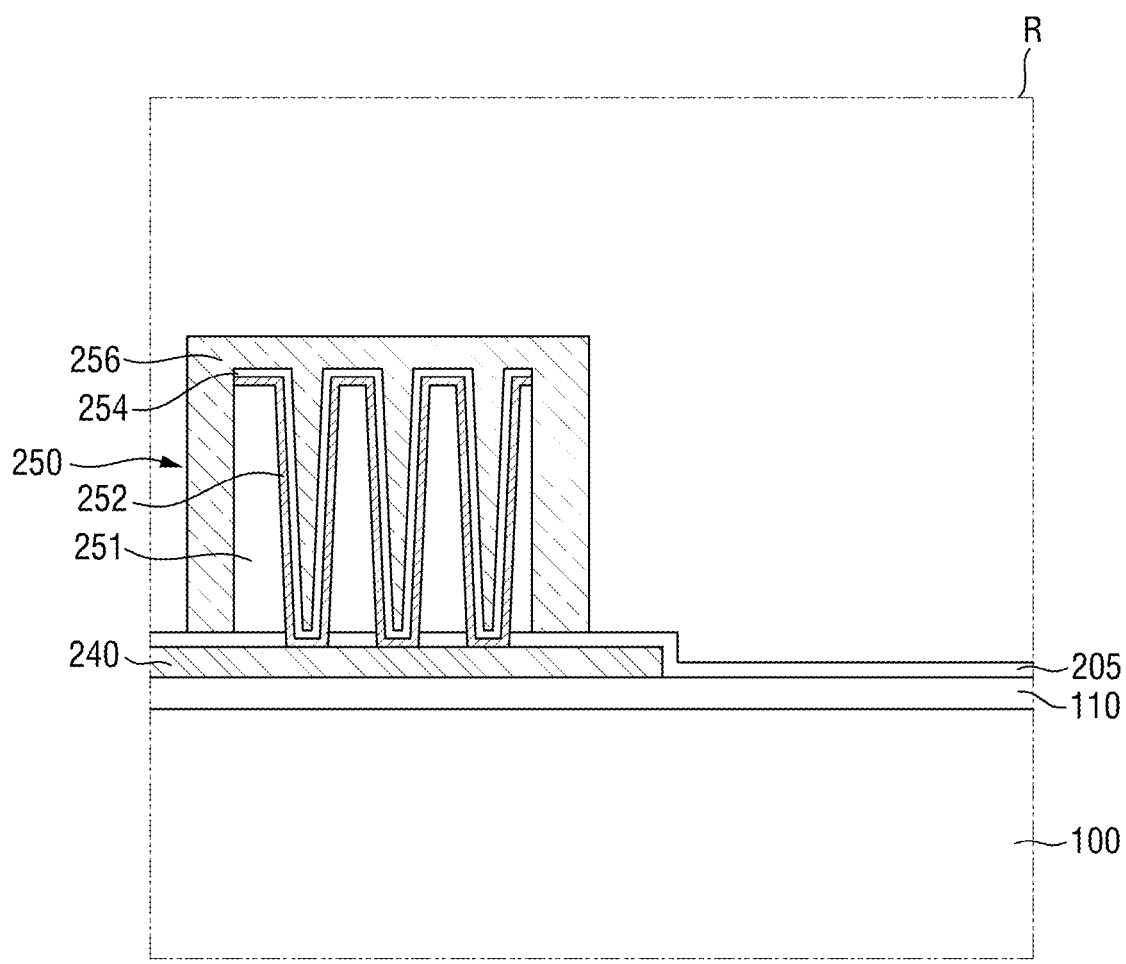

Subsequently, referring to FIGS. 1 and 2, a wiring structure 300 is formed on the first interlayer insulating film 210. As a result, the interposer structure 10 described above using FIGS. 1 and 2 may be formed FIGS. 19 to 21 are intermediate stage diagrams showing a method for fabricating an interposer structure according to some embodiments. For the sake of convenience, repeated parts of contents described above using FIGS. 1 to 18 will be briefly described or omitted. For reference, FIG. 19 is a diagram for explaining the step after FIG. 11.

Referring to FIG. 19, a lower electrode 252 and a capacitor dielectric film 254 are sequentially formed on the support insulating film 251.

The lower electrode 252 may be formed conformally on the support insulating film 251. Accordingly, the lower electrode 252 extending along the top surface of the support insulating film 251, and the bottom surface and the side surface of the first trench T1 may be formed. Since the first trench T1 may expose the top surface of the connection pattern 240, the bottom surface of the lower electrode 252 may be connected to the top surface of the connection pattern 240.

The capacitor dielectric film 254 may extend along the profile of the lower electrode 252. When the capacitor dielectric film 254 includes a plurality of cylinder structures, the capacitor dielectric film 254 may extend along the profiles of each of the cylinder structures.

Since a part of the lower electrode 252 may extend along the top surface of the support insulating film 251, a part of the capacitor dielectric film 254 may also extend along the top surface of the support insulating film 251.

Referring to FIG. 20, the support insulating film 251, the lower electrode 252 and the capacitor dielectric film 254 are patterned.

In some embodiments, the support insulating film 251, the lower electrode 252, and the capacitor dielectric film 254 may be patterned to expose a part of the top surface of the connection pattern 240. For example, a part of the connection pattern 240 may not overlap the support insulating film 251, the lower electrode 252 and the capacitor dielectric film 254 patterned in a direction perpendicular to the top surface of the interposer substrate 100.

Referring to FIG. 21, an upper electrode 256 is formed on the capacitor dielectric film 254.

The upper electrode 256 may be formed to cover the capacitor dielectric film 254. In some embodiments, the upper electrode 256 may cover the side surface of the support insulating film 251.

In some embodiments, the upper electrode 256 may be patterned to expose a part of the top surface of the connection pattern 240. For example, a part of the connection patterns 240 may not overlap the upper electrode 256 patterned in the direction perpendicular to the top surface of the interposer substrate 100.

Subsequently, a first connection via 270, a second connection via 260, and a first penetration via 120 may be formed in the first interlayer insulating film 210. Since formation of the first connection via 270, the second connection via 260, and the first penetration via 120 is substantially the same as that described above using to FIGS. 16 to 18, a detailed description thereof will not be provided below.

Subsequently, referring to FIGS. 1 and 3, the wiring structure 300 is formed on the first interlayer insulating film 210. Thus, the interposer structure 10 described above using FIGS. 1 and 3 may be formed.

Figure 22:
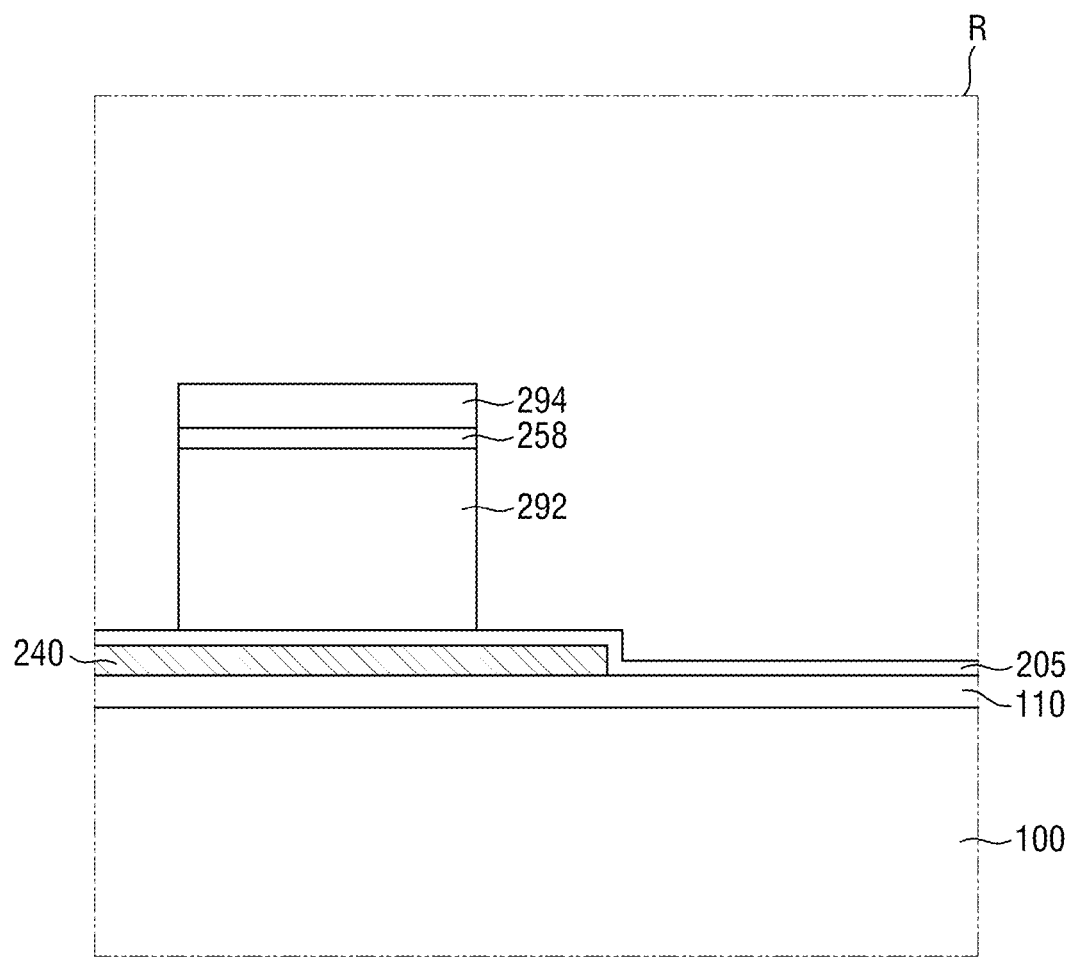
FIGS. 22 to 26 are intermediate stage diagrams for explaining the method for fabricating the interposer structure according to some embodiments.

FIGS. 22 to 26 are intermediate stage diagrams for explaining the method for fabricating the interposer structure according to some embodiments. For the sake of convenience, repeated parts of contents described above using FIGS. 1 to 18 will be briefly described or omitted. For reference, FIG. 22 is a diagram for explaining the step after FIG. 9.

Referring to FIG. 22, a first support insulating film 292, a support pattern 258, and a second support insulating film 294 are sequentially formed on the planarization insulating film 110.

In some embodiments, the support pattern 258 may include a material having an etching selectivity with respect to the first support insulating film 292 and the second support insulating film 294. For example, the support pattern 258 may include silicon nitride, and the first support insulating film 292 and the second support insulating film 294 may include silicon oxide.

In some embodiments, the first support insulating film 292, the support pattern 258, and the second support insulating film 294 may be patterned to expose a part of the top surface of the connection pattern 240. For example, a part of the connection pattern 240 may not overlap the first support insulating film 292, the support pattern 258, and the second support insulating film 294 patterned in the direction perpendicular to the top of the interposer substrate 100.

Figure 23:
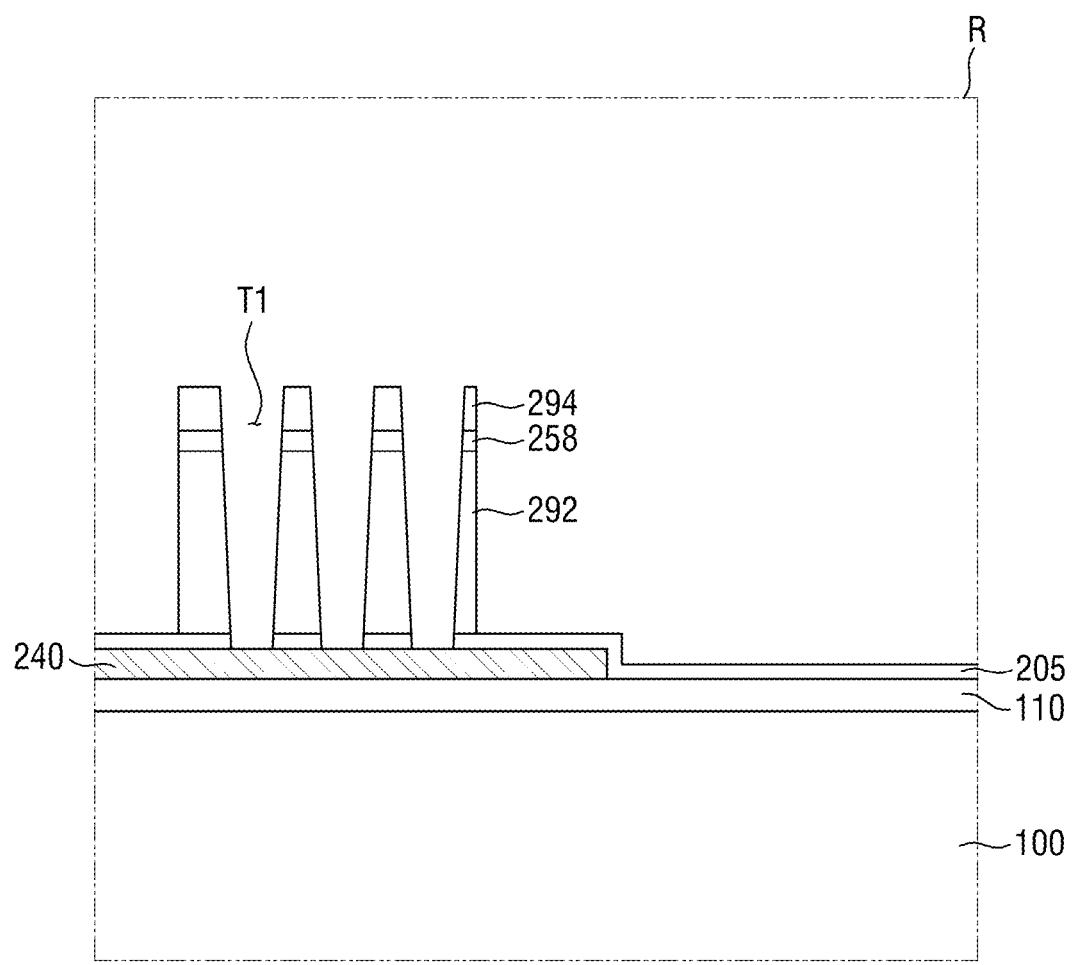

Referring to FIG. 23, the first trench T1 is formed in the first support insulating film 292, the support pattern 258, and the second support insulating film 294.

The first trench T1 may expose a part of the top surface of the connection pattern 240. For example, an etching process that penetrates the first support insulating film 292, the support pattern 258, the second support insulating film 294, and the first etching prevention film 205 to expose the top surface of the connection pattern 240 may be performed.

Figure 24:
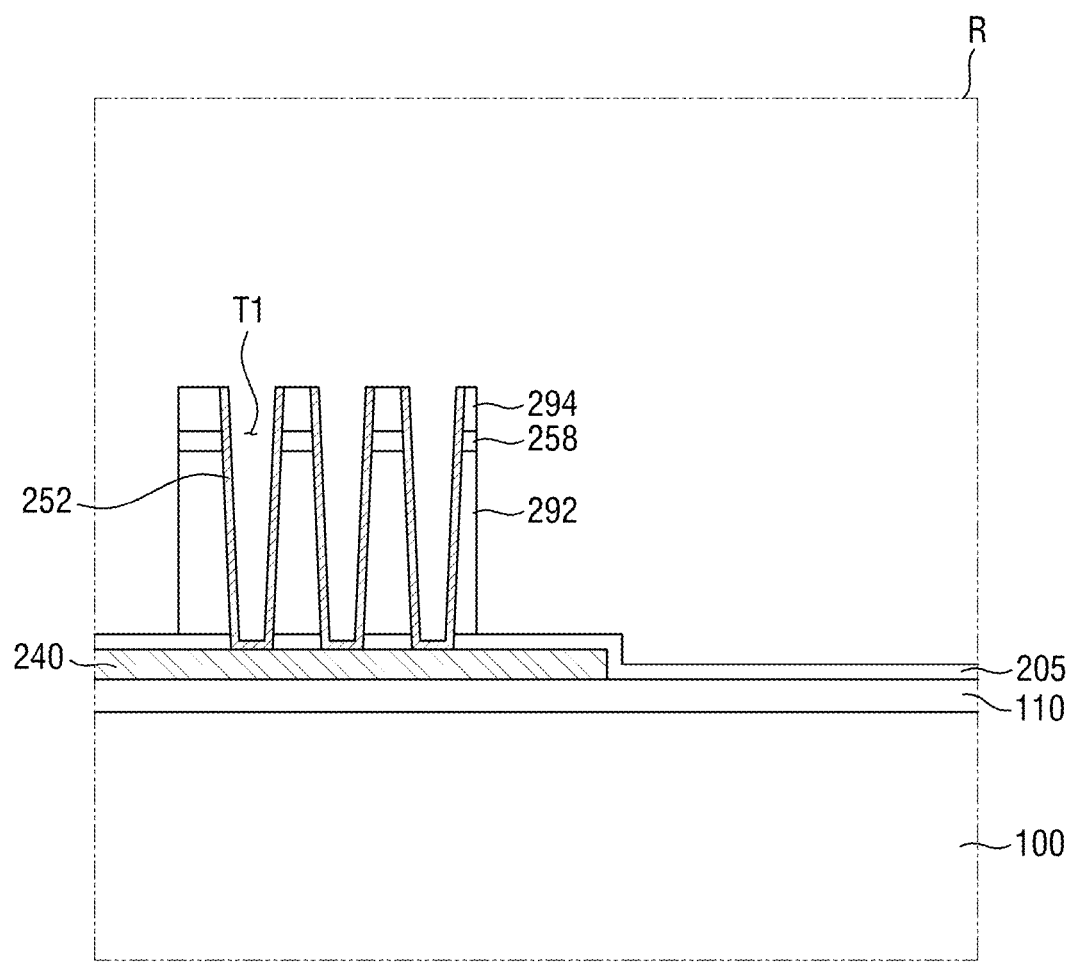

Referring to FIG. 24, the lower electrode 252 is formed in the first trench T1.

The lower electrode 252 may extend along the bottom surface and the side surfaces of the first trench T1. Since the first trench T1 may expose the top surface of the connection pattern 240, the bottom surface of the lower electrode 252 may be connected to the top surface of the connection pattern 240.

Figure 25:
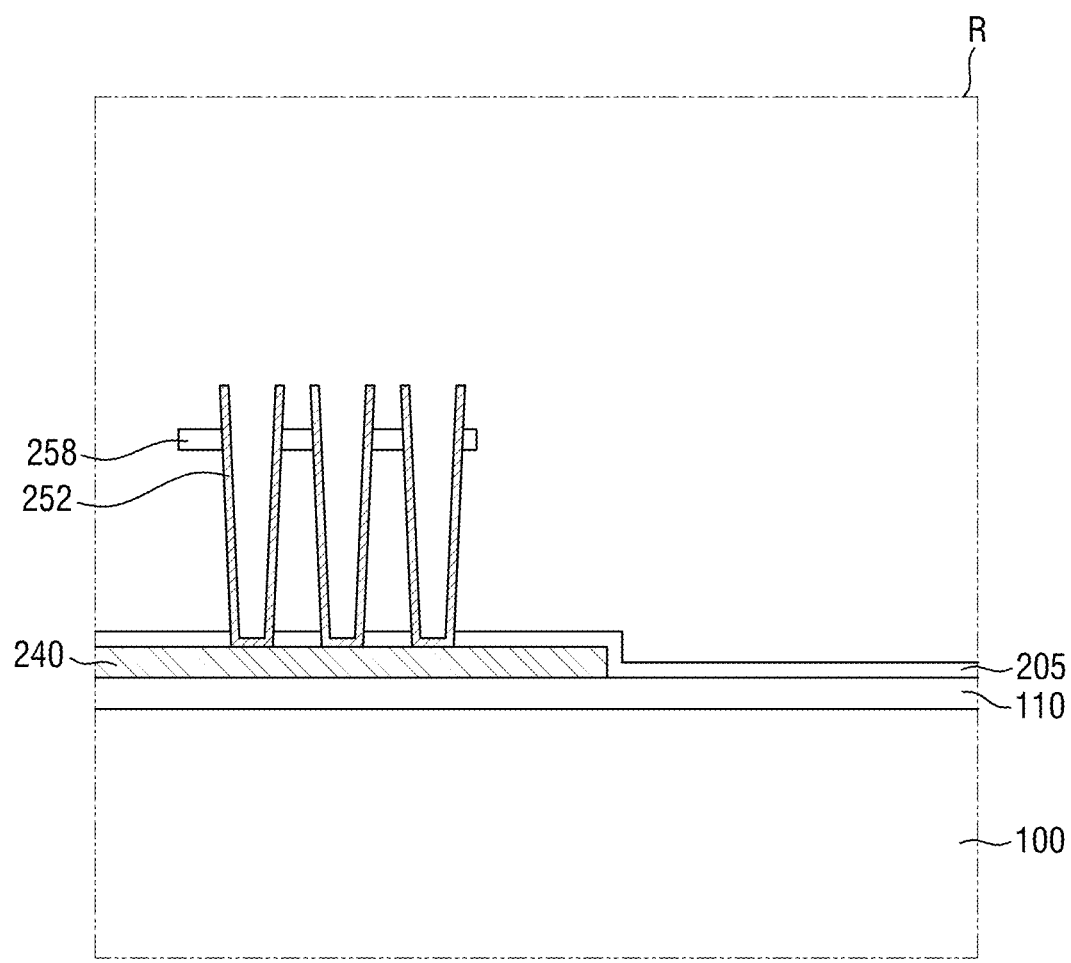

Referring to FIG. 25, the first support insulating film 292 and the second support insulating film 294 are removed.

Thus, a support pattern 258 spaced apart from the bottom surface of the lower electrode 252 may be formed on the side surface of the lower electrode 252. In addition, the support pattern 258 may support the side surface of the lower electrode 252. For example, the support pattern 258 may connect and support the adjacent side surfaces of the cylinder structure which forms the lower electrode 252. Accordingly, a leaning phenomenon and a bending phenomenon of the lower electrode 252 can be reduced or prevented.

Figure 26:
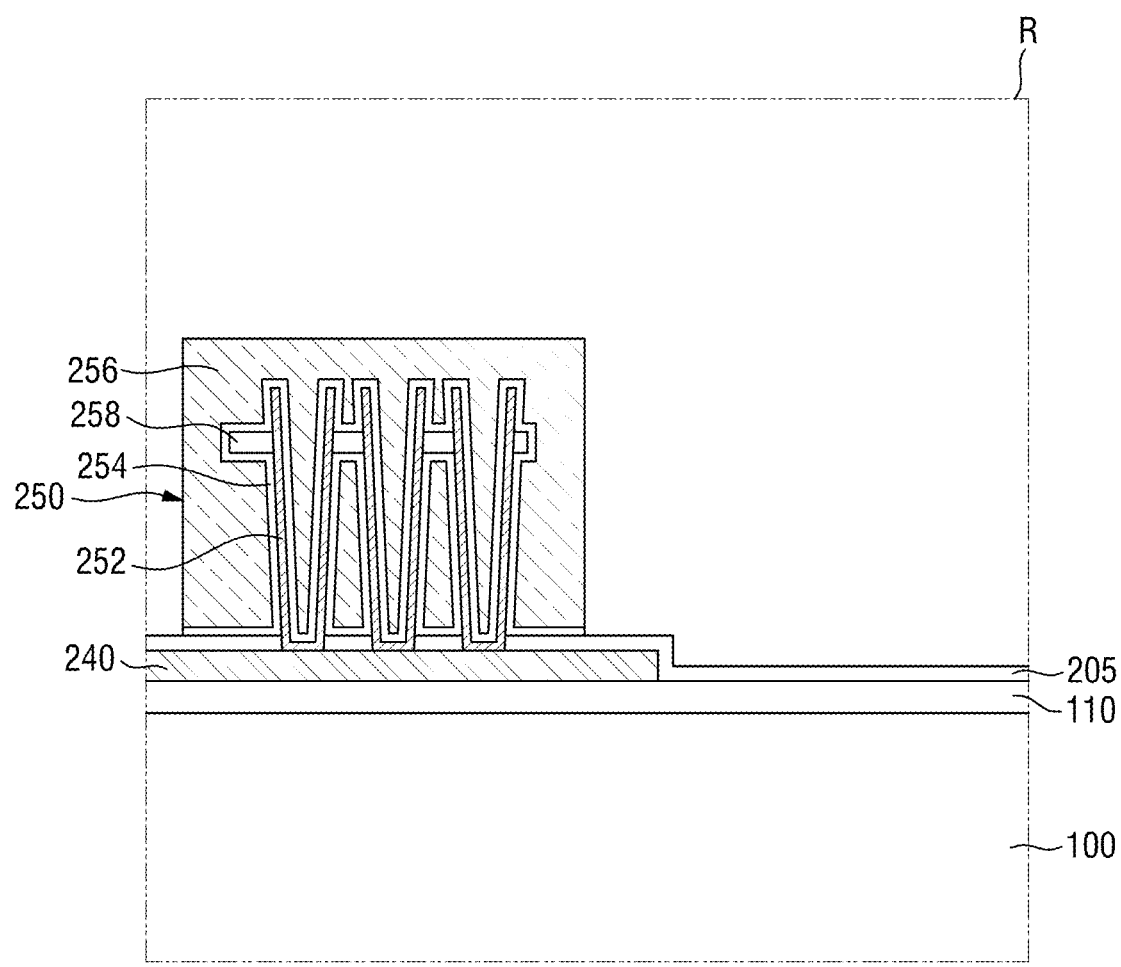

Referring to FIG. 26, the capacitor dielectric film 254 and the upper electrode 256 are sequentially formed on the lower electrode 252.

Since the formation of the capacitor dielectric film 254 and the upper electrode 256 is substantially the same as that described above using FIGS. 14 and 15, a detailed description thereof will not be provided below.

Subsequently, referring to FIGS. 1 and 4, a wiring structure 300 is formed on the first interlayer insulating film 210. Therefore, the interposer structure 10 described above using FIGS. 1 and 4 may be formed.

In concluding the detailed description, those skilled in the art will appreciate that many variations and modifications may be made to the preferred embodiments without substantially departing from the principles of the inventive concepts. Therefore, the disclosed preferred embodiments of the inventive concepts are used in a generic and descriptive sense only and not for purposes of limitation.

What is claimed is:

1. An interposer structure comprising:
   an interposer substrate on which an active element including a transistor is not formed;
   an interlayer insulating film which covers a top surface of the interposer substrate;
   a capacitor structure in the interlayer insulating film;
   a wiring structure including a first wiring pattern and a second wiring pattern spaced apart from the first wiring pattern, on the interlayer insulating film; and
   a connection pattern which extends along a part of the top surface of the interposer substrate and physically contacts a bottom surface of the lower electrode,
   wherein the capacitor structure includes an upper electrode connected to the first wiring pattern, a lower electrode connected to the second wiring pattern, and a capacitor dielectric film between the upper electrode and the lower electrode.

2. An interposer structure comprising:
   an interposer substrate on which an active element including a transistor is not formed;
   an interlayer insulating film which covers a top surface of the interposer substrate;
   a capacitor structure in the interlayer insulating film;
   a wiring structure including a first wiring pattern and a second wiring pattern spaced apart from the first wiring pattern, on the interlayer insulating film;
   a connection pattern which extends along a part of the top surface of the interposer substrate and is connected to a bottom surface of the lower electrode;
   a first connection via which penetrates the interlayer insulating film and connects a upper electrode and the first wiring pattern; and
   a second connection via which penetrates the interlayer insulating film and connects the connection pattern and the second wiring pattern.

3. The interposer structure of claim 1, wherein the lower electrode protrudes from a top surface of the connection pattern in a direction intersecting a top surface of the connection pattern.

4. The interposer structure of claim 1, wherein the capacitor structure further comprises a support insulating film including a trench which exposes a part of the top surface of the connection pattern, and
   the lower electrode extends along a bottom surface and a side surface of the trench.

5. The interposer structure of claim 1, wherein the lower electrode includes a plurality of cylinder structures,
   the capacitor dielectric film extends along profiles of each of the cylinder structures, and
   the upper electrode covers the capacitor dielectric film.

6. The interposer structure of claim 5, wherein the capacitor structure further comprises a support pattern which supports side surfaces of each of the cylinder structures.

7. The interposer structure of claim 6, wherein the capacitor dielectric film extends along profiles of each of the cylinder structures and a profile of the support pattern.

8. The interposer structure of claim 1, further comprising:
   a penetration via which penetrates the interposer substrate and the interlayer insulating film and is connected to the wiring structure.

9. The interposer structure of claim 1, wherein the interposer substrate includes a silicon substrate.

10. The interposer structure of claim 1, wherein the upper electrode includes polysilicon.

11. An interposer structure comprising:
    an interposer substrate on which an active element including a transistor is not formed;
    a first interlayer insulating film which covers a top surface of the interposer substrate;
    a capacitor structure in the first interlayer insulating film, the capacitor structure including a lower electrode;
    a wiring structure which includes a second interlayer insulating film which covers a top surface of the first interlayer insulating film, and a plurality of wiring patterns and a plurality of vias in the second interlayer insulating film;
    a penetration via which penetrates the interposer substrate and the first interlayer insulating film and is connected to the wiring structure; and a connection pattern which extends along a part of the top surface of the interposer substrate and physically contacts a bottom surface of the lower electrode, wherein the capacitor structure is connected to the penetration via.

12. The interposer structure of claim 11, wherein the capacitor structure comprises:
    a capacitor dielectric film which extends along a profile of the lower electrode; and
    an upper electrode which covers the capacitor dielectric film.

13. The interposer structure of claim 12, wherein the lower electrode is connected to the penetration via.

14. The interposer structure of claim 13, wherein the wiring structure comprises:
    a first wiring pattern connected to the upper electrode; and
    a second wiring pattern which is spaced apart from the first wiring pattern and connects the lower electrode and the penetration via.

15. The interposer structure of claim 11, wherein the penetration via comprises:
    a conductive plug which penetrates the interposer substrate and the first interlayer insulating film; and
    an insulating spacer which extends along a side surface of the conductive plug.

16. A semiconductor package comprising:
    a package substrate;
    an interposer structure which is mounted on the package substrate; and
    a first semiconductor chip which is mounted on the interposer structure,
    wherein the interposer structure includes:
        an interposer substrate,
        an interlayer insulating film which covers a top surface of the interposer substrate,
        a capacitor structure in the interlayer insulating film, including a lower electrode,
        a wiring structure which covers a top surface of the interlayer insulating film and is connected to the first semiconductor chip, and
        a connection pattern which extends along a part of the top surface of the interposer substrate and physically contacts a bottom surface of the lower electrode.

17. The semiconductor package of claim 16, wherein the wiring structure electrically connects the capacitor structure and the first semiconductor chip.

18. The semiconductor package of claim 16, wherein the interposer structure further comprises a plurality of penetration vias which penetrates the interposer substrate and the interlayer insulating film and electrically connects the package substrate and the wiring structure.

19. The semiconductor package of claim 18, wherein at least one of the plurality of penetration vias is connected to the capacitor structure.

\* \* \* \* \*